(12) United States Patent
Govoreanu

(10) Patent No.: US 7,626,226 B2
(45) Date of Patent: *Dec. 1, 2009

(54) METHOD FOR IMPROVING ERASE SATURATION IN NON-VOLATILE MEMORY DEVICES AND DEVICES OBTAINED THEREOF

(75) Inventor: Bogdan Govoreanu, Leuven (BE)

(73) Assignee: Interuniversitair Microelektronica Centrum (IMEC), Leuven (BE)

(*) Notice: Subject to any disclaimer, the term of this patent is extended or adjusted under 35 U.S.C. 154(b) by 0 days.

This patent is subject to a terminal disclaimer.

(21) Appl. No.: 11/976,976

(22) Filed: Oct. 29, 2007

(65) Prior Publication Data

US 2008/0185632 A1 Aug. 7, 2008

Related U.S. Application Data

(63) Continuation of application No. 11/367,288, filed on Mar. 2, 2006, now Pat. No. 7,332,768, which is a continuation-in-part of application No. 10/880,415, filed on Jun. 28, 2004, now Pat. No. 7,026,686, which is a continuation of application No. 10/131,923, filed on Apr. 25, 2002, now Pat. No. 6,784,484.

(60) Provisional application No. 60/287,192, filed on Apr. 27, 2001, provisional application No. 60/703,639, filed on Jul. 28, 2005.

(30) Foreign Application Priority Data

Oct. 26, 2001 (EP) .................................. 01204106

(51) Int. Cl.
*H01L 29/94* (2006.01)
(52) U.S. Cl. ................. 257/321; 257/324; 257/E29.304
(58) Field of Classification Search ................. 257/321, 257/324, 325, E29.304, E29.309
See application file for complete search history.

(56) References Cited

U.S. PATENT DOCUMENTS 6,617,639 B1 9/2003 Wang et al.
6,784,484 B2 * 8/2004 Blomme et al. ............. 257/321

FOREIGN PATENT DOCUMENTS

EP 1 411 555 A2 4/2004
EP 1 487 013 A2 12/2004

(Continued)

OTHER PUBLICATIONS

Blomme, P. et al., "Multilayer Tunneling Barriers for NonVolatile Memory Applications", Device Research Conference, 2002, 60th DRC. Conference Digest, Jun. 24-26, 2002, pp. 153-154.

(Continued)

*Primary Examiner*—Minh-Loan T Tran
(74) *Attorney, Agent, or Firm*—McDonnell Boehnen Hulbert & Berghoff LLP

(57) ABSTRACT

Non-volatile memory devices are disclosed. In a first example non-volatile memory device, programming and erasing of the memory device is performed through the same insulating barrier without the use of a complex symmetrical structure. In the example device, programming is accomplished by tunneling negative charge carriers from a charge supply region to a charge storage region. Further in the example device, erasing is accomplished by tunneling positive carriers from the charge supply region to the charge storage region. In a second example non-volatile memory device, a charge storage region with spatially distributed charge storage region is included. Such a charge storage region may be implemented in the first example memory device or may be implemented in other memory devices. In the second example device, programming is accomplished by tunneling negative charge carriers from a charge supply region to the charge storage region. In the second example device, the tunneled negative charge carriers are stored in the discrete storage sites.

20 Claims, 25 Drawing Sheets

FOREIGN PATENT DOCUMENTS

| | | |
|---|---|---|
| EP | 1 411 555 A3 | 2/2005 |
| EP | 1 487 013 A3 | 7/2006 |

OTHER PUBLICATIONS

Blomme, Pierter et al., "Improvement of Write/Erase Cycling of Memory Cells with SiO2/HfO2 Tunnel Dielectric", Integrated Reliability Workshop Final Report, 2003 IEEE International, Lake Tahoe, CA, Oct. 20-23, 2003; pp. 95-98.

European Search Report, European Application No. EP 07 12 1233, dated Feb. 18, 2009.

Blomme, P. et al., "Multilayer Tunneling Barriers for NonVolatile Memory Applications", Device Research Conference, 2002, 60th DRC. Conference Digest, Jun. 24-26, 2002, pp. 153-154.

Blomme, Pierter et al., "Improvement of Write/Erase Cycling of Memory Cells with SiO2/HfO2 Tunnel Dielectric", Integrated Reliability Workshop Final Report, 2003 IEEE International, Lake Tahoe, CA, Oct. 20-23, 2003; pp. 95-98.

European Search Report, European Application No. EP 07 12 1233, dated Feb. 18, 2009.

\* cited by examiner

FIG. 24
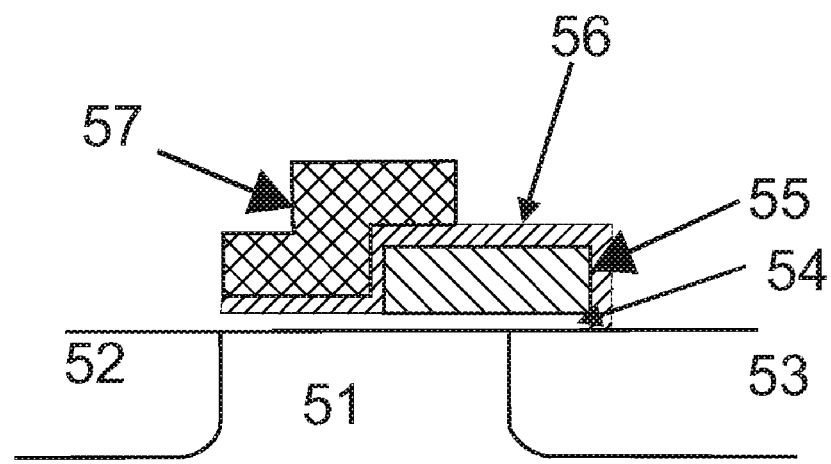
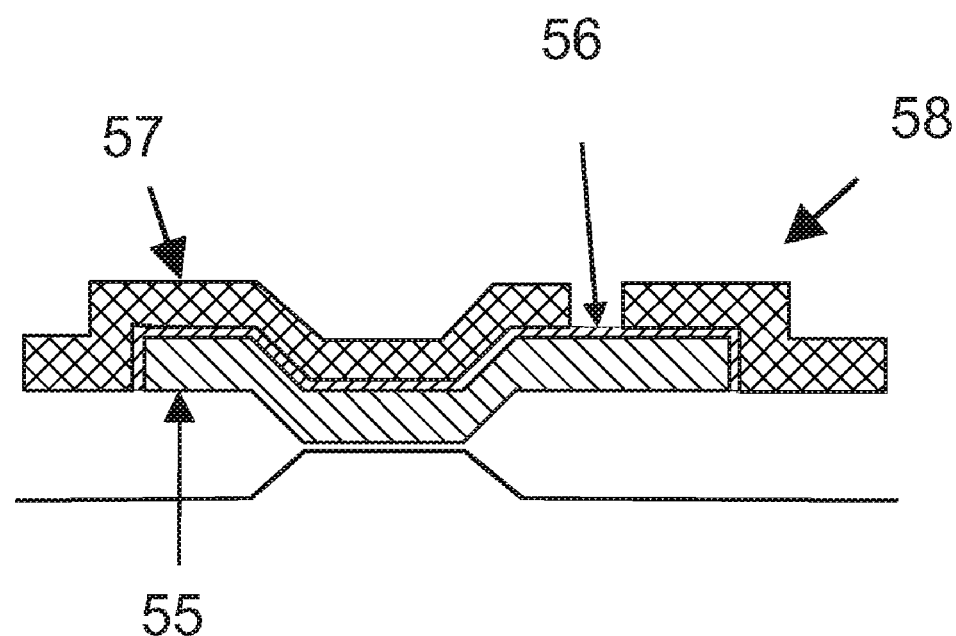
FIG. 25

FIG. 27
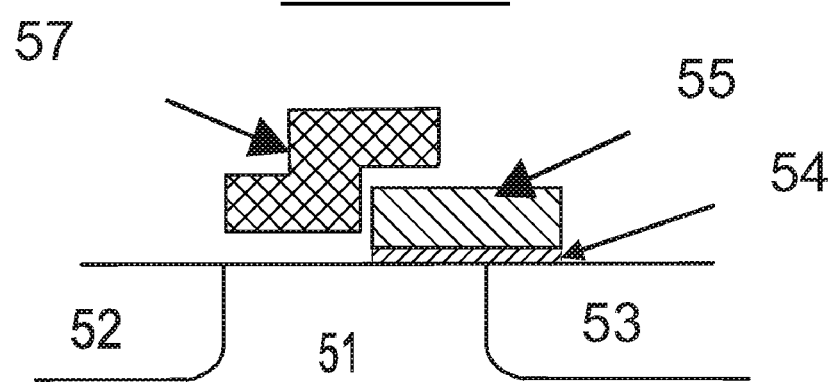
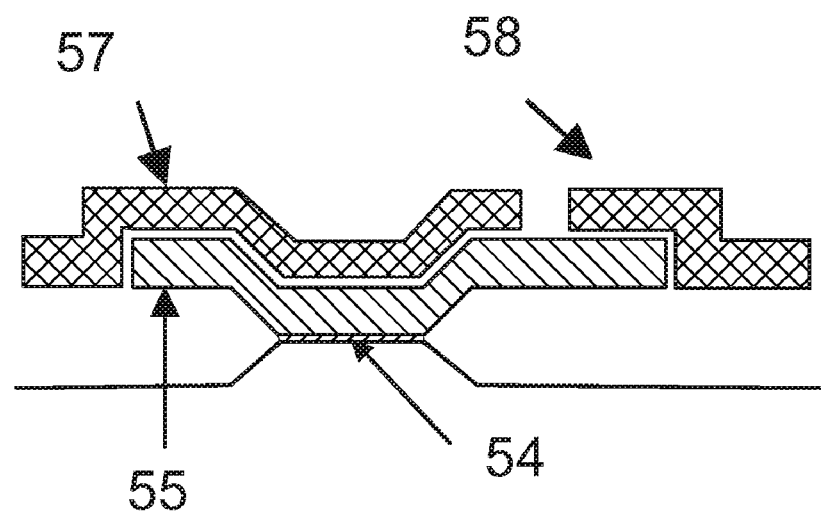
FIG. 28

METHOD FOR IMPROVING ERASE SATURATION IN NON-VOLATILE MEMORY DEVICES AND DEVICES OBTAINED THEREOF

CROSS REFERENCE TO RELATED APPLICATIONS

This is a continuation of U.S. patent application Ser. No. 11/367,288, filed on Mar. 2, 2006, now U.S. Pat. No. 7,332,768, issued on Feb. 19, 2008, which is a continuation-in-part application of U.S. patent application Ser. No. 10/880,415, filed on Jun. 28, 2004 now U.S. Pat. No. 7,026,686, which is a continuation of U.S. patent application Ser. No. 10/131,923, filed on Apr. 25, 2002, now U.S. Pat. No. 6,784,484, issued on Aug. 31, 2003. U.S. application Ser. No. 10/131,923 claims priority benefits to U.S. Provisional Application Ser. No. 60/287,192, filed on Apr. 27, 2001 and also claims priority to European Patent Application EP 01204106.7, filed on Oct. 19, 2001. This application further claims priority benefits to U.S. Provisional Patent Application 60/703,639, filed on Jul. 28, 2005. This application incorporates by reference U.S. patent application Ser. Nos. 10/880,415 and 10/131,923, and U.S. Provisional Application Ser. Nos. 60/287,192 and 60/703,639 in their entirety. This application also incorporates by reference European Patent Application EP 01204106.7 in its entirety.

BACKGROUND

I. Field

This disclosure relates to non-volatile memory devices.

II. Description of Related Art

Non-volatile memory (NVM) devices are used in a wide variety of commercial and military electronic devices and equipment, such as e.g. hand-held telephones, radios and digital cameras. An NVM device comprises an insulating barrier, which can include multiple dielectric layers, located between a charge supply region and a charge storage region. The charge storage region can take the form of a floating gate structure or a charge trapping layer. Programming such NVM devices is accomplished by tunneling charge carriers of a first type, typically electrons, (e.g., from the charge supply region) through the insulating barrier towards the charge storage region.

NVM devices that use charge trapping as a charge storage mechanism instead of a floating gate (FG) are becoming more and more prevalent. Such devices store charge, for example, in a charge trapping layer, such as a silicon nitride layer sandwiched between two oxide layers or, as an alternative, using nano-crystals. Such charge trapping NVM devices are becoming more prevalent, in part, because they are believed to have considerable potential for use in future CMOS generations, in particular, for technologies with dimensions of 90 nm and smaller. One difference between charge trapping devices and floating gate devices is that, for charge trapping devices, electrons are trapped in energy minima that are caused by imperfections in the charge trapping layer, e.g. a silicon nitride layer, or, in the case of nano-crystal memories, on nano-crystals embedded in a gate oxide. These energy minima act as localized charge storage sites that are isolated from each other, in which charge is trapped and stored. In the case of electrons, for example, the free electron energy levels associated with such imperfections and/or nanocrystals are below the free electron energy levels of the surrounding material, thereby creating an energy wells such that, at the location of the imperfections and/or nanocrystals, free electrons are trapped in the created energy wells.

One reason for the growing interest in charge trapping devices is that such devices are relatively easy to scale with associated reductions in physical geometries for future semiconductor processing technology generations. For instance, the use of charge trapping devices eliminates FG patterning issues, such as those related to lithography, overlay and topography.

Moreover, charge trapping devices may be programmed and erased using lower voltages than FG devices implemented on the same semiconductor process. The ability to use lower voltages is important, especially in embedded memories, as the market continues to demand devices that use lower operating voltages and have reduced power consumption. A further advantage of charge trapping NVM devices is excellent program/erase endurance. The program/erase endurance of such charge trapping NVM devices is about two orders of magnitude better than what can be achieved with FG devices.

Current charge trapping NVM devices, however, have certain disadvantages. One disadvantage of such charge trapping devices is their limited data retention capability. Data retention is the ability of an NVM device to retain data programmed into individual memory cells. This limited data retention capability is due, in part, to the use of thin dielectrics between the substrate (e.g., charge supply region) and the charge trapping layer. While the use of a thicker, conventional tunnel dielectric, e.g. $SiO_2$, would improve the data retention capability, this improvement would come at the expense of worsened erase saturation for the devices and, consequently, the duration of a program/erase window (increased duration) for current charge trapping NVM devices. Erase saturation is the inability to completely remove or compensate for the charge stored in the charge storage region of a charge trapping NVM device after programming the device. Therefore, alternative approaches for implementing charge trapping NVM devices are desirable.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are given by way of example and meant to be illustrative, not limiting in scope. In various embodiments, one or more of the above-described problems have been reduced or eliminated, while other embodiments are directed to other improvements.

In a first aspect, non-volatile memory (NVM) devices are disclosed in which programming and erasing may be performed through the same insulating barrier without increasing the complexity of the insulating barrier structure (e.g., by using a symmetrical structure). Additionally, charge-trapping NVM devices are disclosed that have improved data retention over current charge-trapping NVM devices. An exemplary NVM device in which programming and erasing may be performed through the same insulating barrier without increasing the complexity of the insulating barrier structure includes a charge supply region, a charge storage region, and an insulating barrier extending between the charge supply region and the charge storage region.

The charge storage region can either be a conductive floating gate or a layer including localized charge storage sites that are isolated from each other, such as, for example, a charge trapping silicon nitride layer, a charge trapping high-k dielectric layer, a silicon-rich oxide layer, or a dielectric layer with embedded small conductive islands that are isolated from each other. These small conductive islands may take the form of Si or Ge nanocrystals. By establishing an electric field across the insulating barrier (e.g., using signal lines coupled with the NVM device), charge carriers are tunneled from the charge supply region to the charge storage region. The insulating barrier of this exemplary NVM device includes a first portion contacting the charge supply region and a second portion contacting the first portion and extending towards the charge storage region, where the first portion is substantially thinner than the second portion. The first and second portions are each constructed using one or more tunneling dielectrics, which are selected such that the first portion has, on average, a lower dielectric constant than the second portion. Furthermore, the first and second portions have thicknesses which are determined such that efficient tunneling of negative and positive charge carriers from the charge supply region to the charge storage region is readily achievable.

In a second aspect, NVM devices with spatially distributed charge storage sites are disclosed. An example of such an NVM device includes a charge supply region, a charge storage region that includes discrete charge storage sites, where the charge storage sites are isolated from each other, and an insulating barrier extending between the charge supply region and the charge storage region. By establishing an electric field across the insulating barrier, charge carriers are tunneled from the charge supply region to the charge storage region, where the charge carriers are stored in the discrete charge storage sites.

The charge storage region in the example device is a layer that includes localized charge storage sites that are isolated from each other, such as, for example, a charge trapping silicon nitride layer, a charge trapping high-k dielectric layer, a silicon-rich oxide, a dielectric layer with embedded small conductive islands that are isolated from each other. These small conductive islands are preferably made of Si or Ge nanocrystals. The insulating barrier of an NVM device according to this second aspect includes a first portion contacting the charge supply region and a second portion contacting the first portion and extending toward the charge storage region. The first portion is substantially thinner than the second portion. Further, the first and second portions are each constructed using one or more tunneling dielectrics, where the tunneling dielectrics are selected such that the first portion has, on average, a lower dielectric constant than the second portion. The discrete storage sites of the charge storage region may be located at substantially the same, or at variable distances from the charge supply region. The discrete storage sites are located such that they are spatially distributed over at least a portion of the charge storage region.

One advantage of distributing stored charge carriers over such isolated storage sites is that such NVM memory devices will not experience a significant reduction in device performance (e.g., charge retention capability) as a result of the presence of a localized defect in the insulating barrier. For instance, in the event that such a localized defect is present in the insulating barrier of such an NVM device, charge stored in the discrete storage sites would only leak out of the charge storage region locally (e.g., in proximity to the localized defect) due to the fact that the charge storage sites are isolated from each other.

An additional advantage of spatially distributing stored charge at variable distances from the charge supply region in the charge storage region of an NVM device, is that such an approach results in additional insulating barrier (corresponding to the portion of the storage medium between a particular storage site and the insulating barrier) being present for some portion of the charge storage sites. This additional insulating barrier may further improve the ability of such an NVM device to retain stored information for a longer period of time (e.g., data retention performance may be further improved).

BRIEF DESCRIPTION OF THE DRAWINGS

Example embodiments are illustrated in referenced figures of the drawings. It is intended that the embodiments and figures disclosed herein are to be considered illustrative rather than restrictive.

FIGS. 24 and 25 are drawings illustrating cross-sections of yet another memory device according to the second aspect;

FIGS. 27 and 28 are drawings illustrating cross-sections of still yet another memory device according to the second aspect;

DETAILED DESCRIPTION

Figure 1:
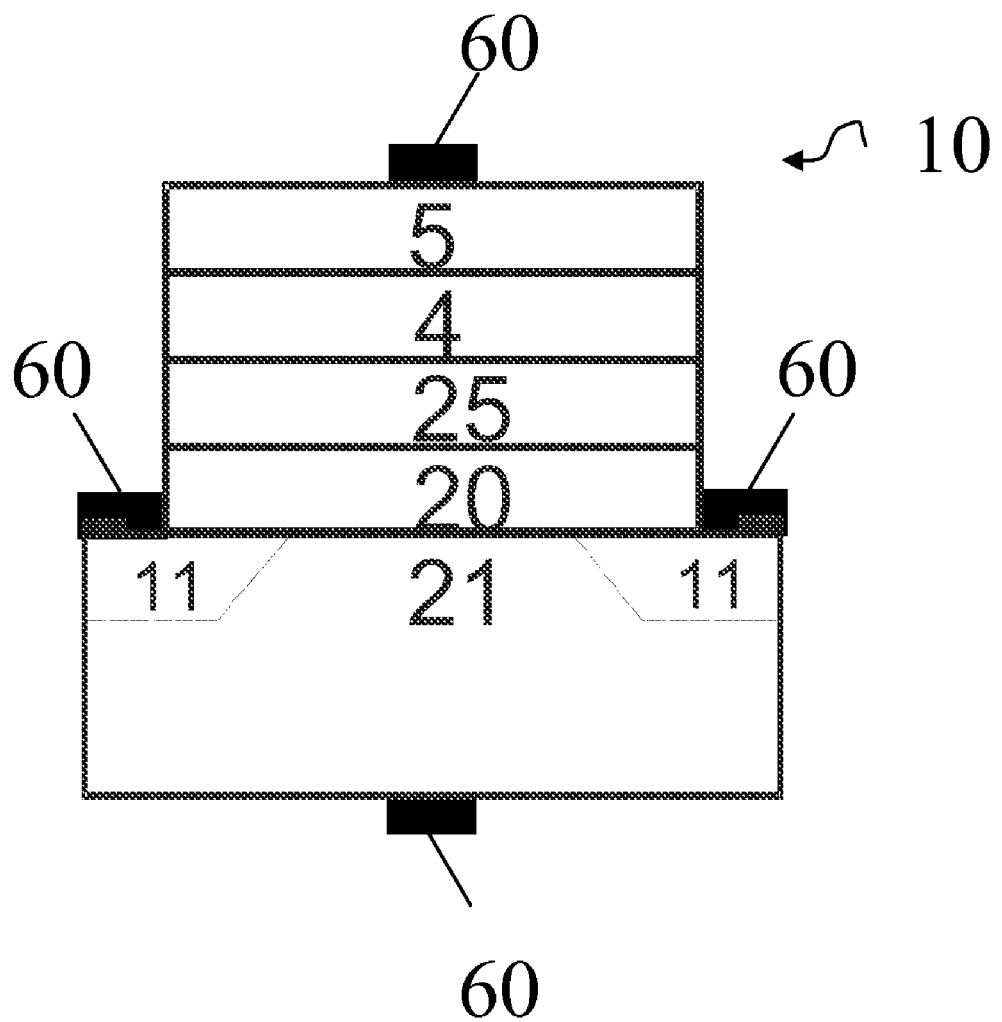
FIG. 1 is a drawing illustrating a schematic cross-section of a non-volatile memory device according to a first aspect.

The example devices described below with reference to the drawings provide for non-volatile memory (NVM) devices in which, in one aspect, data retention is improved over existing NVM devices. The example devices also provide for maintaining low write/erase operating voltages and power consumption without substantially comprising device functionality. In another aspect of the example devices, programming and erasing can be performed through the same insulating barrier without needing a complex structure. These two aspects are to be considered as being independent from each other and the embodiments described below may involve only one, or may involve both of these aspects.

NVM Devices Implementing Programming and Erasing Through a Single Barrier

In a first aspect, non-volatile memory (NVM) devices are disclosed in which programming and erasing may be performed through the same insulating barrier without increasing the complexity of the insulating barrier structure (e.g. such as use of a symmetrical structure). The example devices described below with reference to the drawings provide for non-volatile memory (NVM) devices with which data retention can be improved over existing NVM devices while maintaining low write/erase operating voltages and power consumption without comprising device functionality. An example NVM device in which programming and erasing may be performed through the same insulating barrier without increasing the complexity of the insulating barrier structure includes a charge supply region, a charge storage region, and an insulating barrier extending between the charge supply region and the charge storage region.

The charge storage region can either be a conductive floating gate or a layer of localized charge storage sites that are isolated from each other, such as for example a charge trapping silicon nitride layer, a charge trapping high-k dielectric layer, a silicon-rich oxide layer, or a dielectric layer with embedded small conductive islands that are isolated from each other. These small conductive islands may take the form of Si or Ge nanocrystals. By establishing an electric field across the insulating barrier (e.g., using signal lines coupled with the NVM device), charge carriers are tunneled from the charge supply region to the charge storage region.

The insulating barrier of this example NVM device includes a first portion contacting the charge supply region and a second portion contacting the first portion and extending towards the charge storage region. The first portion is substantially thinner than the second portion. The first and second portions are each constructed using one or more tunneling dielectrics, which are selected such that the first portion has, on average, a lower dielectric constant than the second portion. Furthermore, the first and second portions have thicknesses which are determined such that efficient tunneling of negative as well as positive charge carriers from the charge supply region to the charge storage region is readily achievable.

In FIG. 1, an embodiment of a non-volatile memory device is shown which includes a charge supply region 21, a charge storage region 25, and an insulating barrier 20 extending between the charge supply region 21 and the charge storage region 25. A structure 4, 5 is provided for establishing an electric field over the insulating barrier 20 and for establishing a difference in electrochemical potential over the insulating barrier 20 for tunneling charge carriers (positive and negative, e.g., holes and electrons respectively) from the charge supply region 21 to the charge storage region 25. The charge supply region 21 provides charge carriers of opposite polarities (e.g. both electrons and holes). The structure 4, 5 includes a control region 5, separated from the charge storage region 25 by a second insulating region 4, to which external voltages can be applied in order to establish an electric field over the insulating barrier 20 and for establishing a difference in electrochemical potential over the insulating barrier 20 for tunneling of carriers at least through the insulating barrier 20.

In an alternative embodiment the charge storage region 25 includes discrete charge storage sites that are isolated from each-other. For the purposes of this disclosure, the charge storage region 25 (unless otherwise noted) is assumed to include such discrete charge storage sites, such as conductive nano-particles.

In another alternative embodiment, the charge storage region 25 may comprise a conductive floating gate. The mechanism for establishing an electric field over the insulating barrier 20 and for establishing a difference in electrochemical potential over the insulating barrier 20 for tunneling charge carriers may also be carried out in any number of other ways.

Figure 2:
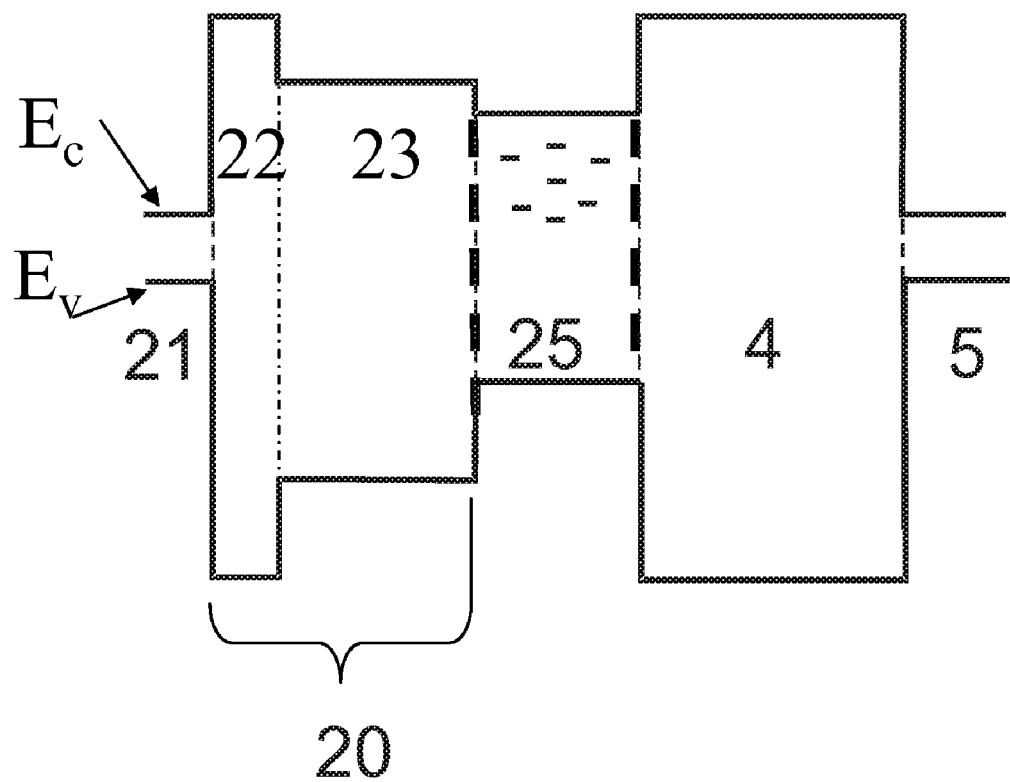
FIG. 2 is a drawing illustrating a schematic representation of an energy band diagram, with illustration of the bottom of the conduction band, Ec, indicative of the potential energy profile for electrons, and of the top of the valence band, Ev, indicative of the potential energy profile for holes, across a bottom-up cross-section of a non-volatile memory device, according to the first aspect.
Figure 13:
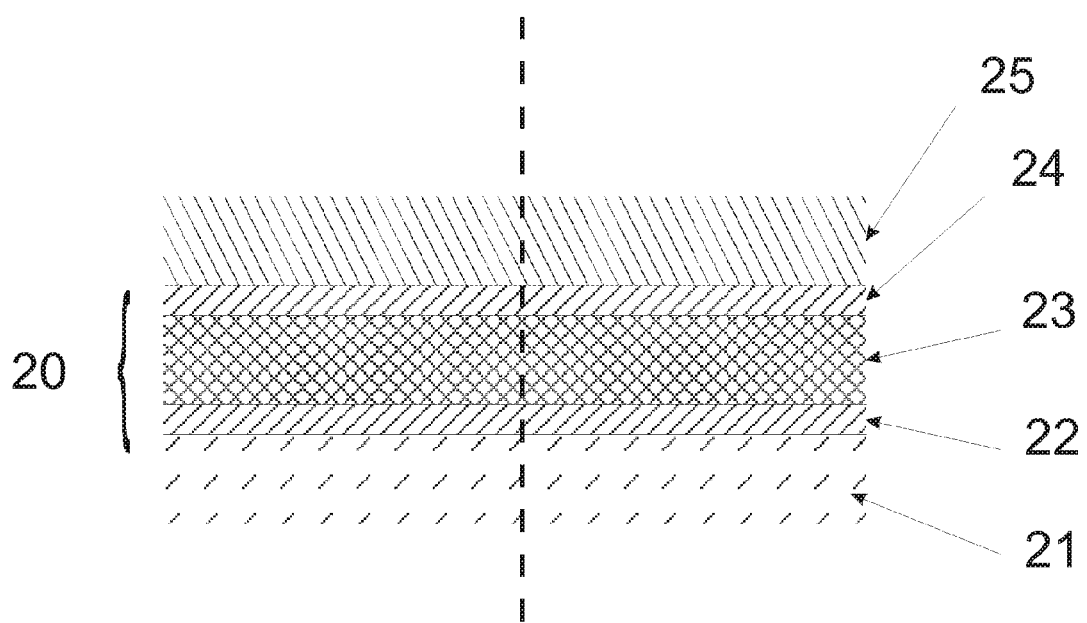
FIG. 13 is a drawing illustrating a cross-section of an insulating barrier according to a second aspect.

As shown in FIG. 2, the insulating barrier 20 comprises a first portion 22 contacting the charge supply region 21 and a second portion 23 contacting the first portion 22 and extending towards the charge storage region 25. Alternatively, the insulating barrier 20 may comprise a third portion 24 in between the second portion 23 and the charge storage region 25 (as is shown in FIG. 13). As illustrated in FIG. 2, the first portion 22 is substantially thinner than the second portion 23. The first and second portions 22, 23 can each be constructed from one or more tunneling dielectrics. The thickness of the first and second portions 22, 23 and their tunneling dielectrics are selected such that upon applying an electric field that is sufficient for establishing a tunneling current through the insulating barrier 20, the potential energy barrier of the second portion 23 is suppressed more than the potential energy barrier of the first portion 22, or is substantially removed. The discrete storage sites of the charge storage region 25 can be located at variable distances from the charge supply region 21, so that they are spatially distributed over at least part of the charge storage region 25.

The physical properties of portions 22, 23 of the insulating barrier 20, such as the dielectric constant and thickness of the materials used to form these portions, are selected such that the electric field over the first portion 22 is stronger than the electric field over the second portion 23 of the insulating barrier 20. The potential energy profile over the first portion 22, therefore, has stronger voltage dependence than the potential energy profile over the second portion 23. This dependence is illustrated in FIG. 3b. As a result of this dependence, the potential energy profile upon applying a suitable voltage for tunneling will show a steeper inclination over the first portion 22 than over the second portion 23.

As a result of the potential energy profile shown in FIG. 3b, a lower external voltage may be used for tunneling with respect to prior art NVM devices with single-layer insulating barriers of equivalent overall thickness. Use of a lower external voltage is possible due to the fact that a comparable reduction in the energy barrier during tunneling may be achieved using a lower voltage for the insulating barrier 20 as compared to previous single-layer insulating barriers. Furthermore, as the first portion 22 is substantially thinner than the second portion 23, the potential energy profile during tunneling includes a larger portion of the profile with a more shallow inclination. This characteristic of the potential energy profile implies that the tunneling voltage can be reduced by a substantial amount with respect to previous single-layer insulating barriers. Thus, the power consumption of the non-volatile memory device can be maintained at a low level.

Furthermore, the presence of the thicker second portion 23 of the insulating barrier 20, whose weaker electric field does not substantially increase the voltage drop over the insulating barrier needed for establishing the tunneling current, increases the physical thickness of the insulating barrier 20. This increased physical thickness provides additional potential energy barrier to tunneling of charge stored in the charge storage region 25 from the charge storage region 25 towards the charge supply region 21. Therefore, the presence of the second portion 23 of the insulating barrier 20 enhances data retention of a non-volatile memory device in which the insulating barrier 20 is implemented.

In the non-volatile memory device shown in FIG. 2, charge carriers are stored in multiple storage sites, isolated from each another, and distributed in energy and space in the charge storage region 25. As a result of this distribution, the memory device has high immunity to data loss due to the presence of a localized defect in the insulating barrier 20. This immunity is a result of the fact that, in the case of such a localized defect, charge stored in the discrete storage sites may only leak out of the storage region 25 locally (e.g., in close physical proximity to the defect) due to the storage sites being isolated (electrically) from each other.

In comparison, for NVM devices implemented using a conductive storage medium (which operates, electrically, as a single charge storage site), such as, for example, a conductive floating gate, stored charge is free to move within the entire storage medium. Therefore, the stored charge can substantially completely leak out of such a charge storage region over time due to the presence of a localized defect, which would cause loss of data.

Another benefit of spatially distributing charge stored in the charge storage region 25 is that such distribution may provide additional insulating barrier, corresponding to the part of the charge storage region 25 between a particular storage site and the insulating barrier 20. This additional insulating barrier may further improve the ability of such an NVM device to retain stored information (e.g., stored charge) for a longer period of time.

The material used to form the charge storage region 25 with discrete storage sites may be selected from the group comprising: a charge trapping silicon nitride layer, a charge trapping high-k dielectric layer, a silicon-rich oxide layer, or a dielectric layer with embedded small conductive islands that are isolated from each other. The small conductive islands may take the form of Si or Ge nanocrystals. However, it will be appreciated that the charge storage region 25 may also be constructed in any other suitable material.

Figure 3A:
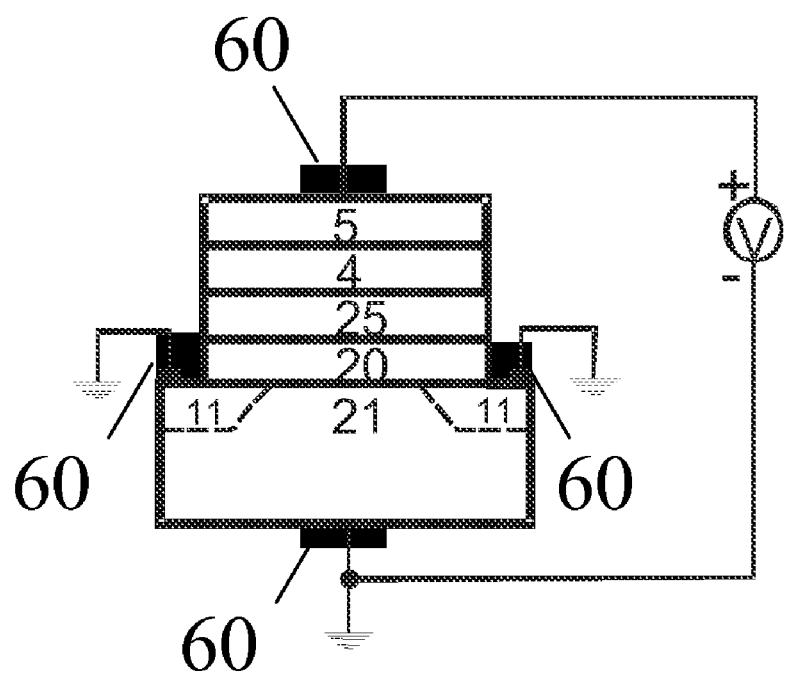
FIG. 3 is a drawing illustrating a schematic representation of (a) a bias set-up for applying external voltages to A non-volatile memory device according to the first aspect and (b) a potential energy Ec profile for electrons across a bottom-up cross-section of the non-volatile memory device under these externally applied voltages when programming the memory device, where the axis Ee conventionally indicates that increasing electron energies are measured in upward direction.
Figure 3B:
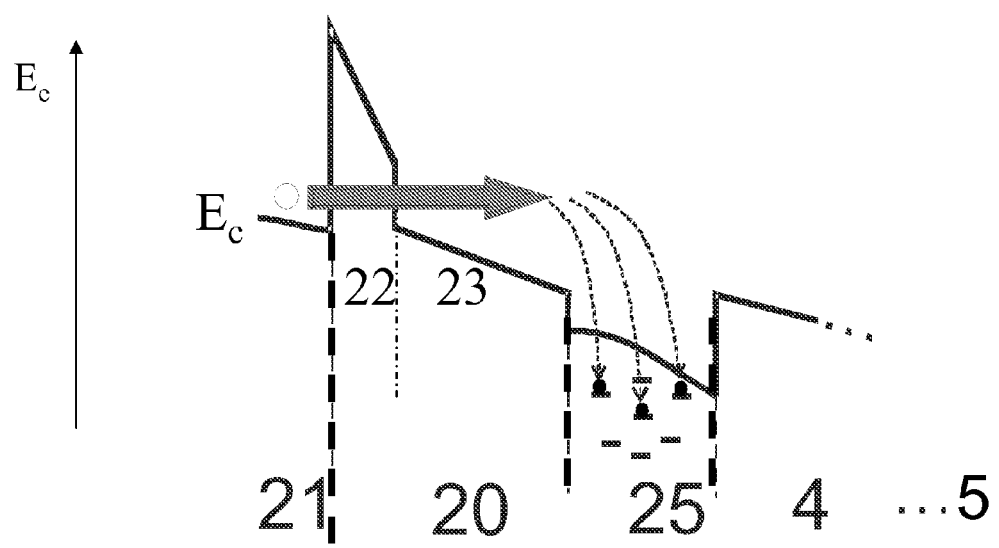

The control region 5 of the NVM device shown in FIGS. 1 and 3a operates as a mechanism for establishing a difference in electrochemical potential over the insulating barrier 20 and establishing an electric field for tunneling carriers through the insulating barrier 20, where the memory device is adapted for applying an external voltage between the control region 5 and the charge supply region 21.

As discussed above, the tunneling dielectrics that are used to form the first and second portions 22, 23 of the insulating barrier 20 may each comprise a single dielectric material. However, the first and second portions 22, 23 may also each include a plurality of suitable dielectric materials, where those dielectric materials are stacked on top of each other. In such an approach, the tunneling dielectrics and the thickness of the portions of the insulating barrier 20 are selected such that the first portion 22 has on average a lower dielectric constant than the second portion 23, such that a majority of an externally applied voltage or electrical field drop between the charge storage region 25 and the charge supply region 21 occurs over the first portion 22.

Suitable material combinations for the two-layered insulating barrier 20 as shown in the drawings are, for example, $SiO_2$, silicon oxynitride such as SiON—typically containing Si, O and N in different ratios, or $Si_3N_4$ for the first portion 22 and $Al_2O_3$, $HfO_2$, Hf silicates such as $HfSiO_x$—containing Hf, Si and O in different ratio's, or HfSiON—containing Hf, Si, O, N in different ratio's, Hf Aluminates such as $HfAlO_x$, containing Hf, Al and O in different ratios or $ZrO_2$ for the second portion 23.

The second portion 23 can, for example, be deposited by various techniques such as atomic layer chemical vapor deposition (ALCVD), metal-organic chemical vapor deposition (MOCVD), which can easily be achieved, or any other method suitable for forming thin dielectric films. Furthermore, $Al_2O_3$, $HfO_2$, Hf silicates, Hf aluminates and $ZrO_2$ are other possible high-dielectric constant materials, which are currently being considered for use in standard silicon semiconductor technology, such as in standard CMOS transistor processes. As a result, using such materials, the insulating barrier 20 may be easily constructed as the use of additional materials, which are not already used in a normal CMOS transistor manufacturing process, may be avoided. Of course, any other suitable material combinations may also be used to implement the insulating barrier 20.

In the embodiment of an NVM device shown in FIG. 2, the insulating barrier 20 includes first and second portions 22, 23 of which the dielectrics are selected such that, in absence of a voltage difference over the insulating barrier 20, the first portion 22 has a higher potential energy barrier than the second portion 23 for carriers for which tunneling is to be blocked. For instance, the energy band diagram of the insulating barrier 20 has a stepped profile with a higher step over the first portion 22 than over the second portion 23. This is advantageous in that the tunneling current through the insulating barrier 20 can be easily controlled by the first portion 22 of the barrier only, such as when a sufficient part of an externally applied voltage drops over the first portion 22. This situation may allow for direct tunneling through the first portion 22 of the insulating barrier 20 only. This embodiment also has a further advantage in that the energy band diagram over the insulating barrier 20 during tunneling descends monotonically.

In the foregoing discussion, a distinction has not been made as to whether the charge carriers tunneling through the insulating barrier 20 are positive or negative charge carriers. This lack of distinction is due to the fact that the foregoing description applies to both types of charge carriers (e.g., electrons and holes). However, in the following discussion, such a distinction will be made for the sake of simplicity, to describe how the insulating barrier 20 functions in enabling tunneling of both types of charge carriers from the charge supply region 21 to the charge storage region 25. Accordingly, the words negative and positive are interchangeable in the following discussion.

In the embodiment shown in FIG. 2, negative charge carriers, which have been stored in the storage region 25 by means of the mechanism described above, can efficiently be removed from discrete charge storage sites of the storage region 25 by establishing a tunneling current of positive charge carriers through the insulating barrier 20 from the charge supply region 21 to the charge storage region 25. This tunneling current of positive charge carriers can also be used to trap positive charge in the discrete storage sites of the storage region 25.

In order to enable a positive tunneling current, the insulating barrier 20 may be engineered accordingly at the process development stage, such as by the selection of appropriate dielectric materials. The insulating barrier 20, being of the same construction as described above, includes the first portion 22 contacting the charge supply region 21 and the second portion 23 contacting the first portion 22 and extending towards the charge storage region 25. In order to achieve a tunneling current of positive charge carriers, the thickness of the first and second portions 22, 23 and the tunneling dielectrics are selected such that upon applying a suitable electric field over the insulating barrier 20, the potential energy barrier of the second portion 23 is suppressed more than the potential energy barrier of the first portion 22, or is substantially removed for positive charge carriers. The applied electric field corresponds to a voltage drop over the insulating barrier 20 of opposite polarity compared to the polarity of the voltage drop applied for storing negative charge in the charge storage region 25. This voltage drop reduces the potential energy barrier for tunneling positive charge carriers and, therefore, establishes a tunneling current of positive charge carriers (e.g. holes) through the insulating barrier 20 from the charge supply region 21 to the charge storage region 25.

Because engineering of the insulating barrier 20 does not substantially affect the charge storage region 25, the insulating barrier 20 can be used in NVM devices having a charge trapping storage region 25 as shown in FIG. 2, as well as in floating gate NVM devices. In such floating gate devices, the positive tunneling current can either be used for removing negative charge from the floating gate or storing a positive charge in the floating gate, in similar fashion as with charge trapping devices.

In the embodiment shown in FIG. 2, the tunneling dielectrics of the first and second portions 22, 23 are selected such that, in absence of an electric field over the insulating barrier 20, the first portion 22 has a higher potential energy barrier for holes than the second portion 23. The dielectrics are further selected such that the strength of the electric field and, therefore, the voltage drop for tunneling positive charge through the insulating barrier 20 substantially completely shifts the potential energy of the second portion 23 below the energy level of the positive charge carriers which are supplied by the charge supply region 21. In this way, the energy barrier of the second portion 23 is fully or substantially removed during tunneling, so that the tunneling current of positive charges is substantially determined by direct or Fowler-Nordheim tunneling of holes through the thinner first portion 22. This situation is illustrated in the energy band diagram of FIG. 4b.

An electric field for tunneling positive charge carriers may be established by applying a voltage difference between the charge supply region 21 and the control region 5. The control region 5 is located on the opposite side of the charge storage region 25 with respect to the charge supply region 21 and is separated from the charge storage region 25 by the second insulating barrier 4.

The charge supply region 21 provides both types of charge carriers, e.g. electrons and holes. The charge supply region 21 may be implemented using a semiconductive material, such as Si, which can be doped with p-type dopants, such as e.g. boron, or n-type dopants, such as phosphorus or arsenic. The charge supply region 21 includes two regions 11, typically denoted source and drain, which are schematically shown by the dotted lines in FIG. 1. The regions 11 are highly doped with dopants of a type opposite to the dopants of the main area (body) of the charge supply region 21. In the case of a p-doped body of the charge supply region 21, the regions 11 are of n-type, such as for example silicon doped with P or As. In the case of an n-doped body of the charge supply region 21, the regions 11 are of p-type, such as for example silicon doped with B. The doping of the body of the charge supply region 21 can be realized through various techniques, such as ion implantation.

Each of the regions 11 is electrically connected to an external electrode 60. The regions 11 act as charge reservoirs for providing charge carriers of an opposite type as compared to the charge carriers supplied by body of the charge supply region 21 when corresponding biases are applied. The regions 11 are also used when determining the amount and type of charge stored in the charge storage region 25 (e.g., when reading the NVM device). This sensing can be realized by applying appropriate external voltages between the corresponding electrodes 60 connected to the two regions 11 and between the two respective electrodes 60 connected to the control region 5 and the charge supply region 21. This external biasing allows for reading out a current flowing between the regions 11. This current depends, for a given external bias, on the amount and type of charge stored in the charge storage region 25.

The structure 10 of FIG. 1 is electrically controlled by the control region 5, which is separated from the charge storage region 25 by the second insulating barrier 4. The control region 5 is electrically contacted by an electrode 60. Hence the charge storage region 25 is sandwiched between two dielectric regions 20, 4 that isolate the charge storage region 25 from the carrier supply region 21 and the control region 5, respectively. The structure 10 forms an NVM device with at least four electrodes 60, such that a voltage difference and hence an electric field can be applied over the insulating barrier 20 for tunneling charge carriers from the charge supply region 21 to the charge storage region 25 and for reading out the charge stored in the charge storage region 25.

The charge storage region 25 may be implemented with (i) a charge trapping silicon nitride layer, (ii) a charge trapping high-k dielectric (insulating) layer, (iii) a silicon-rich oxide layer, or (iv) a dielectric (insulating) layer with embedded small conductive islands, which are isolated from each another. These islands may take the form of Si or Ge nanocrystals, or a conductive material, e.g. a metal, which can accommodate one or more carriers in a narrow spatial region corresponding to a potential energy well.

The second insulating barrier 4 can be a silicon oxide layer, such as $SiO_2$, which is thick enough to efficiently block any carrier exchange between the control region 5 and the charge storage region 25. Alternatively, the insulating barrier 4 can be formed of any other suitable insulating material, e.g. a high-k dielectric like aluminum oxides e.g. $Al_2O_3$, hafnium oxides e.g. $HfO_2$, hafnium silicates e.g. $HfSiO_x$ compounds containing Hf, Si, O in different ratios, or HfSiON compounds containing Hf, Si, O, N in different ratios, hafnium-aluminates e.g. $HfAlO_x$ compounds containing Hf, Al, O in different ratios, zirconium oxides, e.g. $ZrO_2$.

The control region 5 can be formed of any appropriate conductive material. Straightforward implementations are highly doped polycrystalline silicon, either of n- or p-type, a metal, or a compound with a metallic character such as a metal-silicide, e.g. $TiSi_2$, nickel-silicide, e.g. NiSi, $Ni_2Si$, a conductive metal-nitride, such as TiN or TaN, or a conductive metal-oxide such as $RuO_2$.

The energy band diagram of FIG. 2 shows the potential energy profiles at a flatband voltage condition and in the absence of charge trapped in any of the dielectric regions 20, 4 in between the charge supply region 21 and the control region 5, for the bands relevant for both electron transport (e.g. the conduction band, the potential energy profile being given by the bottom of the conduction band, Ec) and hole transport (e.g. the valence band, the potential energy profile being given by the top of the valence band, Ev).

The asymmetric insulating barrier 20 is suitable (as opposed to a more complex symmetrical structure), because only tunneling from the charge supply region 21 towards the charge storage region 25 is used in the example NVM device. The asymmetric structure is formed by the first portion 22 which has a low dielectric constant (e.g. below 15) and which neighbors the charge supply region 21 and the second portion 23 which has a high dielectric constant (e.g. above 7) and which neighbors the charge storage region 25. However, as discussed above, the first portion 22 in this example has, on average, a lower dielectric constant than the second portion 23.

The first portion 22 may be a silicon oxide layer, such as $SiO_2$, a nitride layer e.g. $Si_3N_4$, a silicon oxynitride layer, such as SiON, consisting of Si, O and N in different ratios or a combination thereof. The second portion 23 may be a high-k dielectric such as aluminum-oxides e.g. $Al_2O_3$, hafnium oxides e.g. $HfO_2$, hafnium silicates, e.g. $HfSiO_x$, HfSiON, hafnium-aluminates, e.g. $HfAlO_x$, zirconium oxides, e.g. $ZrO_2$. The potential energy barrier of the second portion 23 is less than the potential energy barrier of the first portion 22, but in alternative embodiments the potential energy barriers could be substantially the same.

For electrons, the potential energy barrier of the first portion 22 (e.g., the bottom of its conduction band Ec) may be higher than or substantially the same as the potential energy barrier of the second portion 23. For holes the potential energy barrier of the first portion 22 (e.g., the top of its valence band Ev) may be higher than or substantially the same as the potential energy barrier of the second portion 23. The charge storage region 25 has potential energy barriers for both types of charge carriers (e.g. electrons and holes) that can be lower (as shown in FIG. 2), higher or substantially the same as the potential energy barrier of the second portion 23 of the insulating barrier 20. The one or more dielectric materials of the first portion 22 and the one or more dielectric materials of the second portion 23 are selected such that upon applying an external voltage between the control region 5 and the charge supply region 21 sufficient for tunneling of carriers between the charge supply region 21 and the charge storage region 25, the strength of the electric field over the first portion 22 is greater than the strength of the electrical field over the second portion 23 for both types of charge carriers. See FIGS. 3b and 4b. Furthermore, the thickness of the first portion 22 and the thickness of the second portion 23 are selected such that upon applying an external voltage between the region 5 and the charge supply region 21 sufficient for tunneling of carriers between the charge supply region 21 and the charge storage region 25, the potential energy barrier of the second portion 23 is suppressed more than the potential energy barrier of the first portion 22, or is substantially removed for both type of charge carriers.

Operation of the NVM device of FIGS. 1 and 2 is illustrated by FIGS. 3 to 6. The two logical states of the device, conventionally defined, are: a logic "1" when sufficient negative charge (e.g., electrons) is transferred to the charge storage region 25 during a write or program step, and a logic "0" when charge corresponding to the written state is either removed from the charge storage region 25, or electrically neutralized by compensation or recombination with charge of opposite polarity (e.g., holes in the case of electrons being stored during programming). The logic '0' state is characterized in that the charge storage region 25 is either electrically neutral, or it has a significantly smaller net negative charge as compared to the logic '1' state. Alternatively, the charge storage region 25 may have a net positive charge when erased or in the logic "0" state (e.g., of an opposite polarity as compared to the logic "1" state).

Writing (programming) of the memory device may be achieved by applying a programming voltage to the control region 5 that is sufficient to tunnel negative carriers (electrons) in one energy band (conduction band) from the charge supply region 21 through the insulating barrier 20 into the charge storage region 25. If, for example, a positive programming voltage is applied to control region 5 with respect to the charge supply region 21, electrons will tunnel from the conduction band of the charge supply region 21 to the charge storage region 25, where they are then trapped in charge storage sites. Tunneled electrons may be provided by the source/drain regions 11 (which are typically grounded) as minority carriers from the inversion layer formed at the interface between the body of the charge supply region 21 and the insulating barrier 20, if the body (main portion) of the charge supply region 21 is p-type doped. Alternatively the tunneled electrons may be provided as majority carriers by the body of the charge supply region 21, if the body of the charge supply region 21 is implemented as an n-type doped semiconductor material.

The above first situation (e.g. electrons supplied as minority carriers) is illustrated in FIG. 3b, which schematically shows the variation of the potential energy profile for electrons Ec for the NVM device 10 illustrated in FIG. 1. For the profile illustrated in FIG. 3b, a positive programming voltage is applied to the control region 5 using the biasing set-up shown in FIG. 3a. In such an arrangement, a major fraction of the voltage applied over the NVM device 10 will drop over the regions 20 and 25 and a smaller fraction of this externally applied voltage will drop over the second insulating barrier 4. The charge, indicated by solid circles, is stored at physically separated locations, indicated by the dashes, within the charge storage region 25. These locations may be charge traps in a dielectric material or allowed energy levels in small conductive regions, such as conductive dots, nanocrystals, or other material.

The allowable energy levels for charge storage may vary over the charge storage region 25 from one storage site to another, such that the charge storage region 25 is not characterized by a single energy level at which charge can be stored but, rather, by a distribution of energy levels at which injected charge can be stored. Furthermore, these physically separated charge storage sites may be spatially distributed across a part of, or over substantially the entirety of the charge storage region 25 where the charge storage sites are present at variable distances from the charge supply region 21, as is illustrated in FIG. 3b.

Erasing of the NVM device 10 is realized by applying an erase voltage to the control region 5 with respect to the charge supply region 21. The erase voltage has an opposite polarity as compared to the programming voltage applied to the control region 5 when writing the NVM device. The erase voltage should be sufficient for tunneling of carriers from the charge supply region 21 through the insulating barrier 20 into the charge storage region 25 in an energy band, other than the energy band for tunneling of carriers when programming the memory device. The carriers tunneled during erase are thus of a polarity opposite to the polarity of carriers tunneled from the charge supply region 21 to the charge storage region 25 during programming.

Figure 4A:
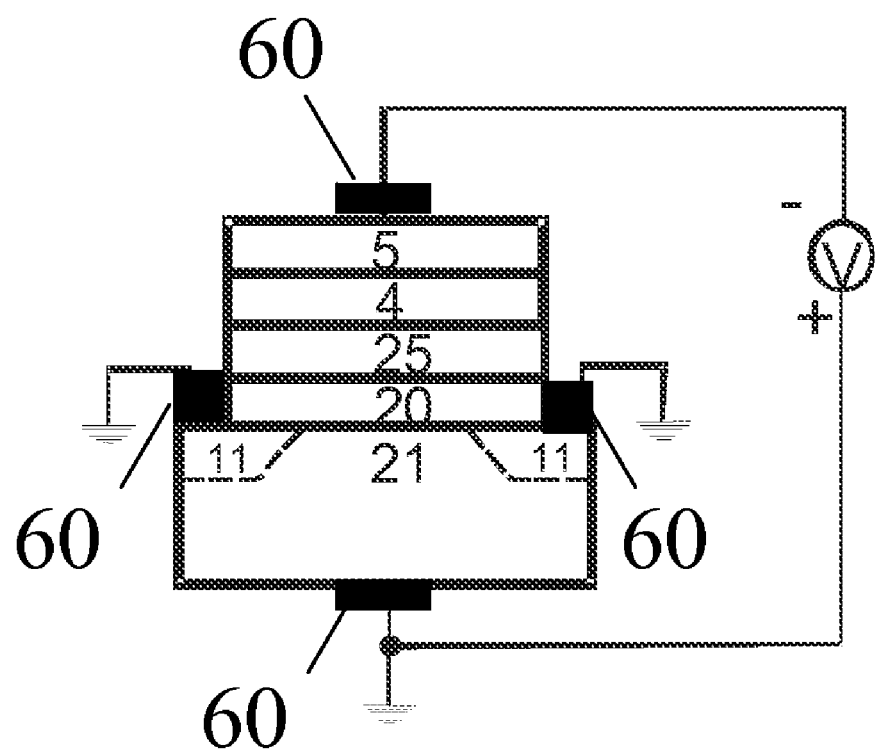
FIG. 4 is a drawing illustrating a schematic representation of (a) a bias set-up for applying external voltages to A non-volatile memory device according to the first aspect and (b) a potential energy Ev profile for holes across a bottom-up cross-section of a non-volatile memory device under these externally applied voltages, when erasing the memory device where the axis Eh conventionally indicates that increasing hole energies are measured in downward direction.

If, for example, a negative erase voltage is applied to the control region 5 with respect to the charge supply region 21, as is illustrated in FIG. 4a, holes will tunnel from the valence band of the charge supply region 21 to the charge storage region 25. The holes can be either majority carriers accumulated at the interface between the charge supply region 21 and the insulating barrier 20, in the case where the charge supply region is implemented with p-type doped silicon. Alternatively, the holes can be provided as inversion layer minority carriers supplied by p+-doped source/drain regions 11, such as in the case where the body of the charge supply region 21 is implemented with n-type doped silicon. The holes injected into the charge storage region 25 will neutralize (substantially in whole or in part) charge carriers stored during writing of the non-volatile memory device by compensation or recombination.

Such neutralization will result in the charge storage region 25 of the NVM device 10 being placed in a substantially neutral state or, alternatively, in a state of net positive charge. Thus, the erased state is either electrically neutral or substantially different from the written state with respect to net charge stored in the charge storage region 25. This difference in net charge stored will result in a substantially different threshold voltage of the non-volatile memory device 10. The NVM device 10 being in such a state is said to be erased.

Figure 4B:
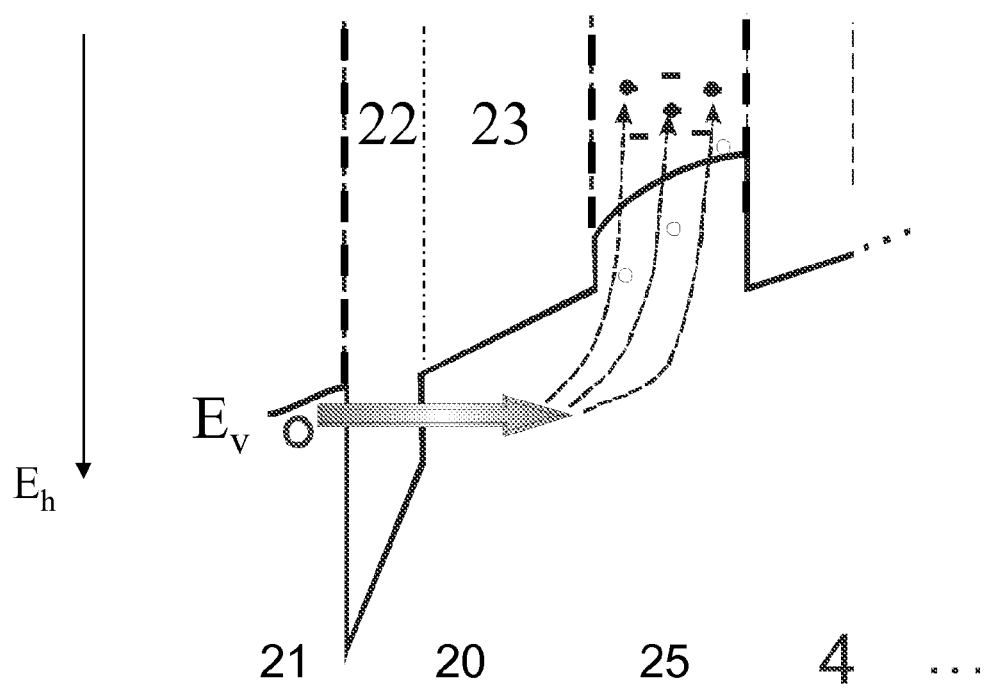

An energy band diagram for the NVM device 10 is depicted schematically in FIG. 4b. FIG. 4b shows the variation of the potential energy profile for holes Ev in the non-volatile memory device 10, where a negative erase voltage is applied to the control region 5 in the biasing arrangement illustrated by FIG. 4a. In this situation, a larger fraction of the voltage applied over the device 10 will drop over the regions 20 and 25 and a smaller fraction of this externally applied voltage will drop over the second insulating barrier 4. The charge carriers of opposite polarity (holes) to those stored during programming (electrons) are indicated by open circles. The holes tunnel through the insulating barrier 20 into the charge storage region 25 where they interact with the electrons (depicted by solid circles) stored therein at physically separated locations (indicated by dashes). The tunneled holes neutralize, or even exceed the charge of the stored electrons by compensation or recombination. After such neutralization, the non-volatile memory device 10 is said to be erased.

The charge supply region 21 is engineered to supply sufficient carriers of both polarity types, e.g. electrons and holes. For instance, the charge supply region 21 may be a semiconductive material like silicon, silicon-germanium or any other semiconducting material(s) known in the art. The charge supply region 21 may also be implemented using any other material capable of providing both types of charge carriers.

Embodiments of NVM devices described herein may offer the advantage of combining low write/erase voltages with improved charge retention. The improved charge retention is due to, at least in part:

(i) A larger physical thickness of the insulating barrier 20, of which a large part is associated with the second portion 23 of the insulating barrier 20. This larger physical thickness provides additional tunneling barrier for charge stored in the charge storage region 25.

(ii) An intrinsic effect in the asymmetric insulating barrier 20, which causes the potential energy barrier to be less sensitive to internal electrical potentials generated by negative charge stored in the charge storage region 25 during writing. This internal electrical potential will have the same effect as biasing the insulating barrier 20 in a reverse mode which occurs when erasing as opposed to the forward biasing mode, which occurs when programming the non-volatile memory device.

Figure 5:
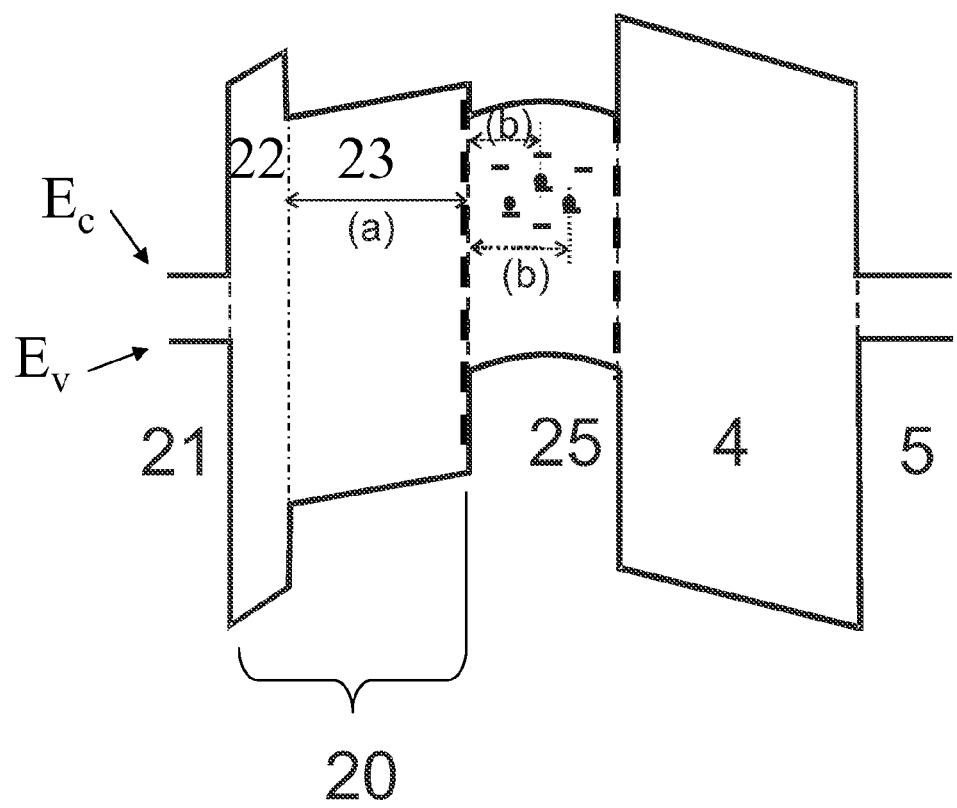
FIG. 5 is a drawing illustrating a schematic representation of the energy band diagram of A non-volatile memory device according to the first aspect when programmed and in the absence of any external applied voltages.

FIG. 5 shows a schematic representation of an energy diagram for the NVM device 10 illustrated in FIG. 1. This energy band diagram represents the situation when no external voltage is applied and when charge (e.g., negative charge) is stored in the charge storage region 25. Arrow (a) illustrates the advantage of improved retention of charge stored on the storage sites in the charge storage region 25 due to the additional physical barrier provided by the high-dielectric constant second portion 23 of the insulating barrier 20. Arrows (b) illustrate the advantage of improved retention of charge due to the spatial distribution of charge storage sites adding to the physical barrier from additional distance from the charge supply region 21.

In FIG. 5, the shape of the band diagram for the second insulating layer 4 may vary depending on the particular embodiment and is a function of the implementation choices made for the second insulating barrier 4. For instance, instead of using a single dielectric material as shown in FIGS. 2 to 5, the second insulating barrier 4 may be implemented using multiple dielectric materials, which may be used to form a stack similar to the dielectric stack used to form the insulating barrier 20.

The performance of the NVM device 10 can be further improved if, instead of a semiconductive material as shown in FIGS. 2 to 5, a material with metallic characteristics and with a predefined workfunction (Wm), with respect to a vacuum, is used to form the control region 5. Alternatively, the second insulating barrier 4 can be a high-k dielectric or a combination of high-k and low-k dielectrics similar to the first insulating barrier 20. The thickness and the materials selected for the second insulating barrier 4 need not be the same as for the insulating barrier 20. Further, the high-k and low-k dielectrics can be arranged in an order different from the order used in the insulating barrier 20.

Figure 6:
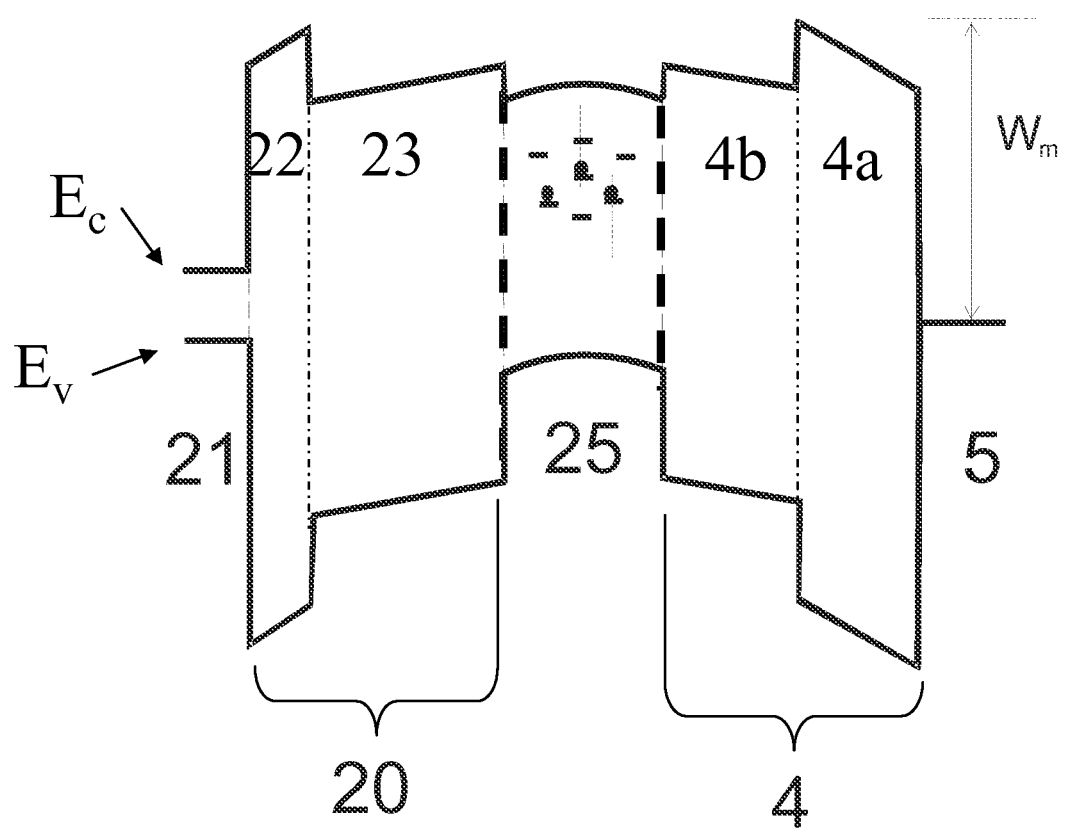
FIG. 6 is a drawing illustrating a schematic representation of the energy band diagram of The NVM device of the first aspect when programmed and in the absence of any external applied voltages, where a low-k/high-k dielectric stack is used for both insulating layers and a metal layer is used for the control region.

FIG. 6 illustrates a schematic representation of a potential barrier diagram of an NVM device with such an implementation for the second insulating barrier 4. This potential energy band diagram represents such an NVM device when no external voltage is applied and when charge (negative charge) is stored in the charge storage region 25. Compared to the NVM device represented by the band diagram of FIG. 5, the second insulating barrier 4 for the NVM device represented in FIG. 6 consists of two portions 4a, 4b. A first portion 4a of the insulating barrier 4 has a low dielectric constant and neighbors the control region 5. A second portion 4b of the insulating barrier 4 has a high dielectric constant and neighbors the charge storage region 25. The first portion 4a has, on average, a lower dielectric constant than the second portion 4b.

The first portion 4a of the insulating barrier 4 may be a silicon oxide layer, such as SiO2, a silicon nitride layer e.g. Si3N4, a silicon-oxynitride layer or a combination thereof. The second portion 4b of the insulating barrier 4 may be a high-k dielectric like aluminum oxides e.g. Al2O3, hafnium oxides e.g. HfO2, hafnium silicates, e.g. HfSiOx, HfSiON, hafnium aluminates, e.g. HfAlOx, zirconium oxides, e.g. ZrO2. The control region 5 for this particular NVM device is formed of a metal or metallic compound having a work function Wm, the value of which may be close the Fermi level of highly-doped n-type silicon (around 4 eV). Furthermore, if the work function of the material used for control region 5 is selected to be near mid-gap of crystalline silicon or near the Fermi level of highly-doped p-type silicon (e.g. ranging from about 4.5 to about 5.5 eV), the likelihood of an electron tunnel current from the control region 5 to charge storage region 25 occurring, which could result from the negative voltage applied during the erase operation, is significantly reduced. If such an arrangement is not used, such an electron current might adversely affect the NVM device performance by erase saturation, as additional negative charge would be injected into the charge storage region 25, which may slow down or even prevent the erase operation. Use of a metal material with a high workfunction for the control region 5 may increase immunity to erase saturation, thus improving device functionality.

Charge Storage Region with Distributed Charge Storage Sites

In a second aspect, NVM devices with spatially distributed charge storage sites are disclosed. An example of such an NVM device includes a charge supply region, a charge storage region and an insulating barrier extending between the charge supply region and the charge storage region. The charge storage region in the example device is a layer of localized charge storage sites that are isolated from each other, such as for example a charge trapping silicon nitride layer, a charge trapping high-k dielectric layer, a silicon-rich oxide layer, or a dielectric layer with embedded small conductive islands that are isolated from each other. These small conductive islands may take the form of Si or Ge nanocrystals, as have been discussed above. By establishing an electric field across the insulating barrier, charge carriers are tunneled from the charge supply region to the charge storage region, where the charge carriers are stored in the discrete charge storage sites.

Prior Approaches

Figure 7:
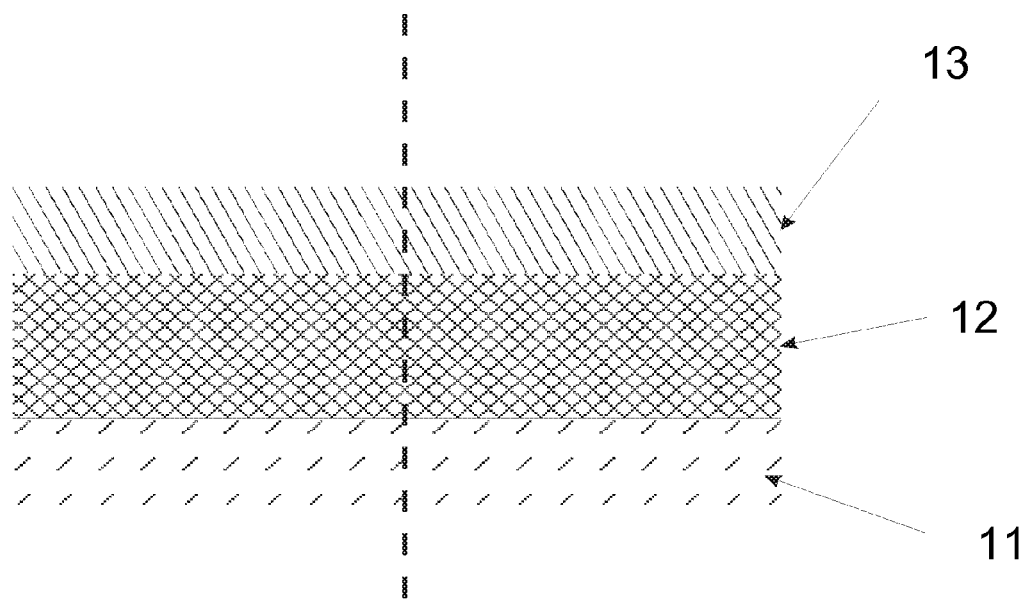
FIG. 7 is a drawing illustrating a cross-section of a prior art single-layer insulating barrier.
Figure 8:
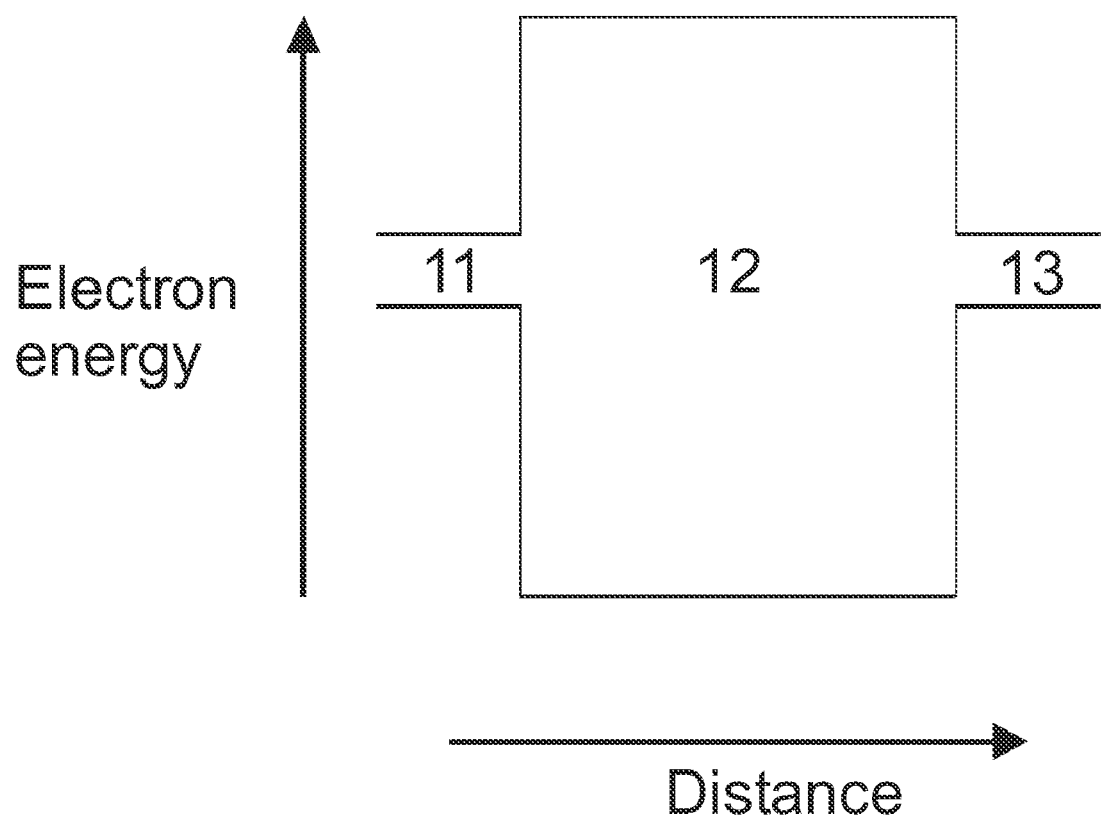
FIG. 8 is a drawing illustrating an energy band diagram of the prior art insulating barrier of FIG. 7 when no voltage is applied.
Figure 9:
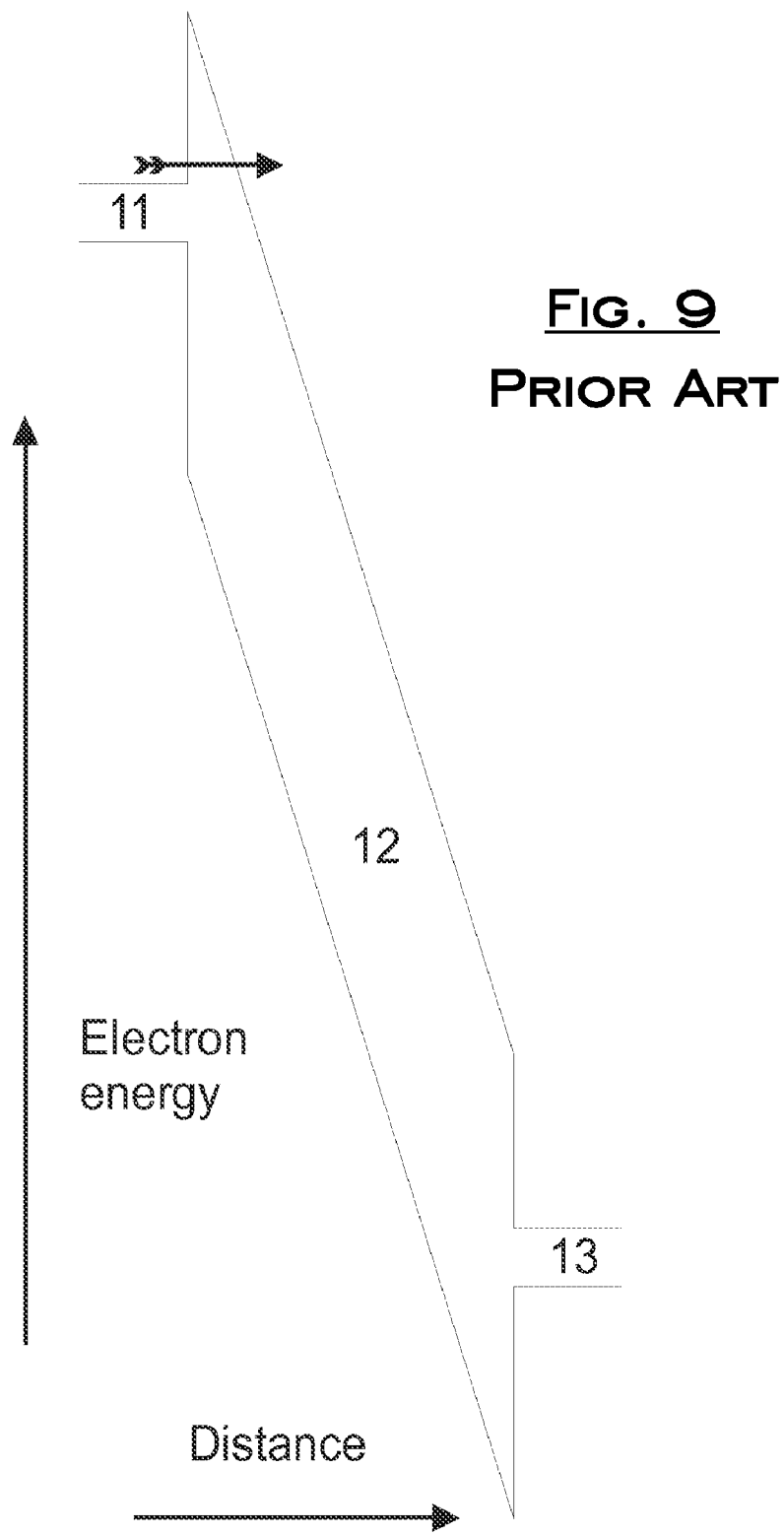
FIG. 9 is a drawing illustrating an energy band diagram of the prior art insulating barrier of FIG. 7 when a tunneling voltage is applied.
Figure 10:
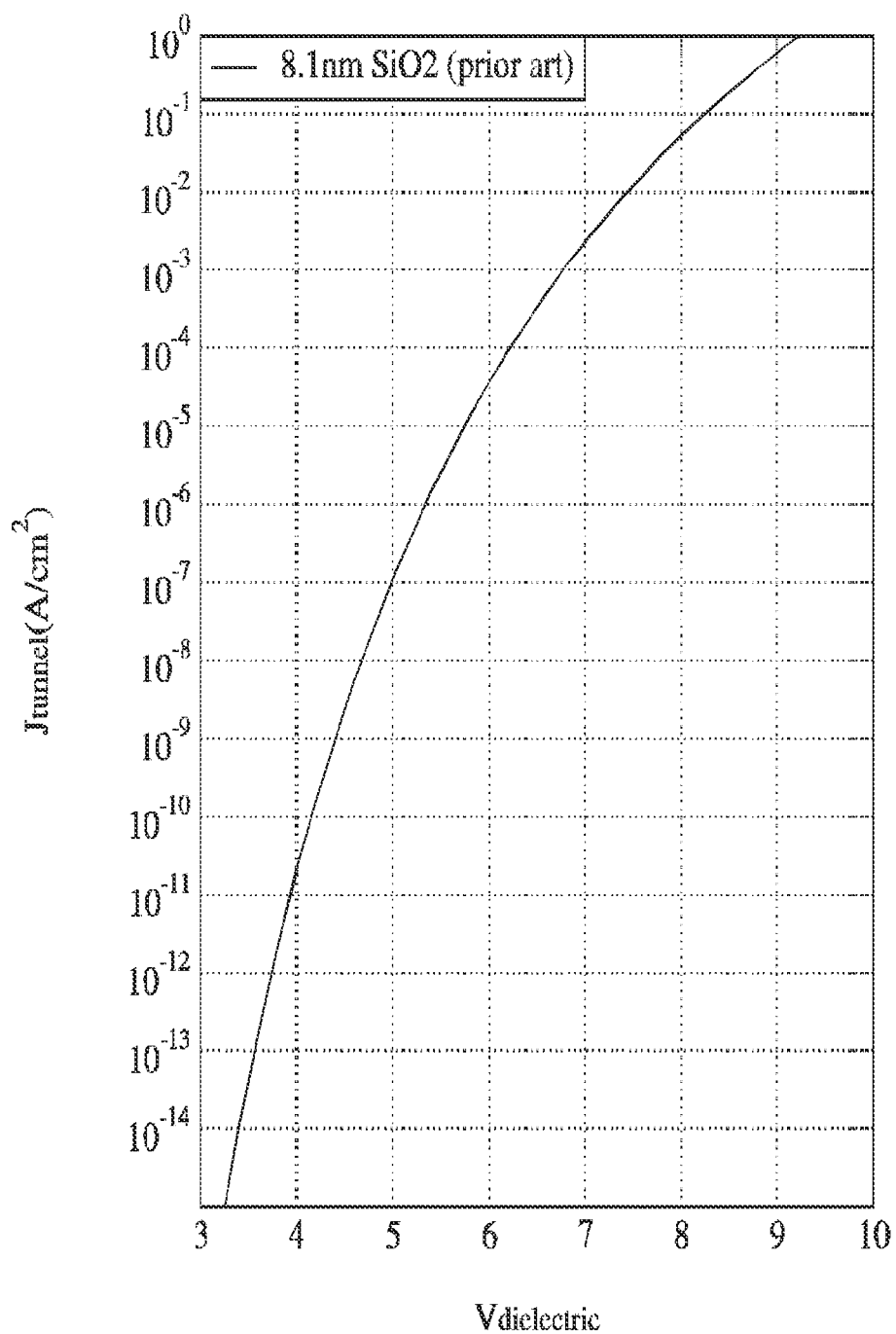
FIG. 10 is a plot of current versus voltage characteristics for the prior art insulating barrier of FIG. 7.

FIG. 7 is a drawing illustrating a cross-section of a prior art single-layer insulating barrier 12. The insulating barrier 12 extends between a first conductive region 11 and a second conductive region 13. FIG. 8 illustrates an energy band diagram of the prior art insulating barrier of FIG. 7 when no voltage is applied. FIG. 9 illustrates an energy band diagram of the prior art insulating barrier of FIG. 7 when a tunneling voltage is applied. FIG. 10 is a plot of current versus voltage characteristic for the prior art insulating barrier of FIG. 7.

Figure 11:
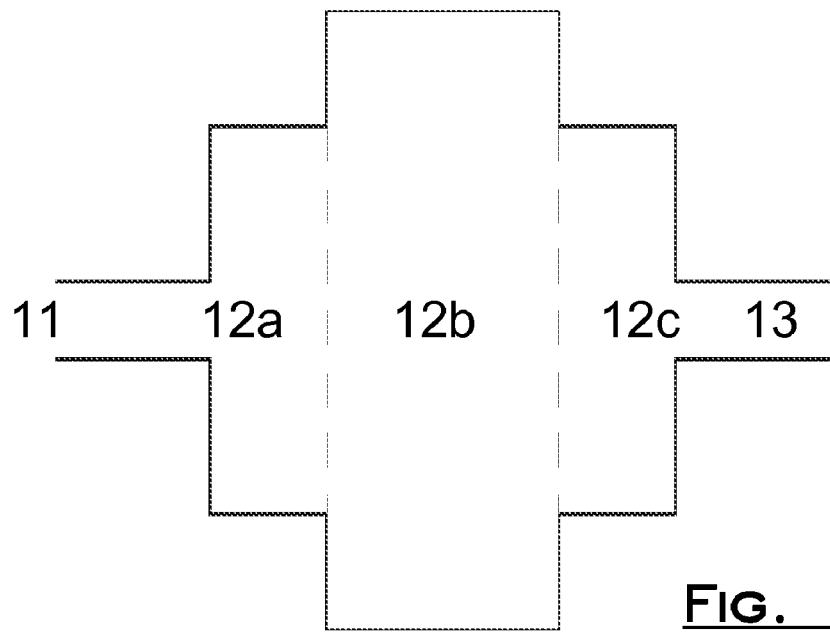
FIG. 11 is a drawing illustrating an energy band diagram of a second prior art insulating barrier when no voltage is applied.
Figure 12:
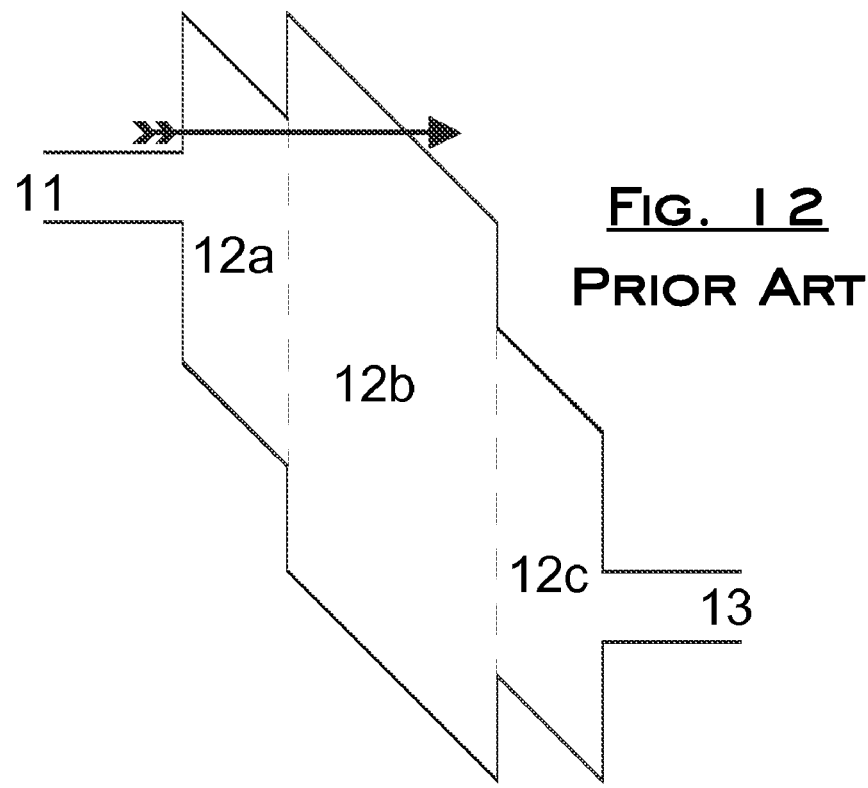
FIG. 12 is a drawing illustrating an energy band diagram of the second prior art insulating barrier when a tunneling voltage is applied.

FIG. 11 is a drawing illustrating an energy band diagram of a second prior art insulating barrier when no voltage is applied. The insulating barrier extends between a first conductive region 11 and a second conductive region 13. The insulating barrier is formed as a sandwich of three layers 12a, 12b, 12c with different band gaps. The band gap of the two outer layers 12a, 12c is less than the band gap of the middle layer 12b. FIG. 12 is a drawing illustrating an energy band diagram of the second prior art insulating barrier when a tunneling voltage is applied.

Insulating Barrier Examples

Referring to FIG. 13, an example insulating barrier 20 that may be implemented in an NVM device in accordance with the second aspect is illustrated. It is noted that like reference numbers from the above discussion are used to reference analogous and/or like elements in the devices described throughout this disclosure. In FIG. 13, the insulating barrier 20 extends between a conductive region 21 (e.g., charge supply region) and a nitride layer 25 (e.g., charge storage region) and comprises first, second and third layers 22, 23, 24, which are formed one on top of the other. The first and third layers 22 and 24 are formed with a first dielectric material having a low dielectric constant. The second layer 23 is substantially thicker than the first and third layers 22 and 24 and is constructed in a second dielectric material having a higher dielectric constant than the first dielectric material.

Figure 14:
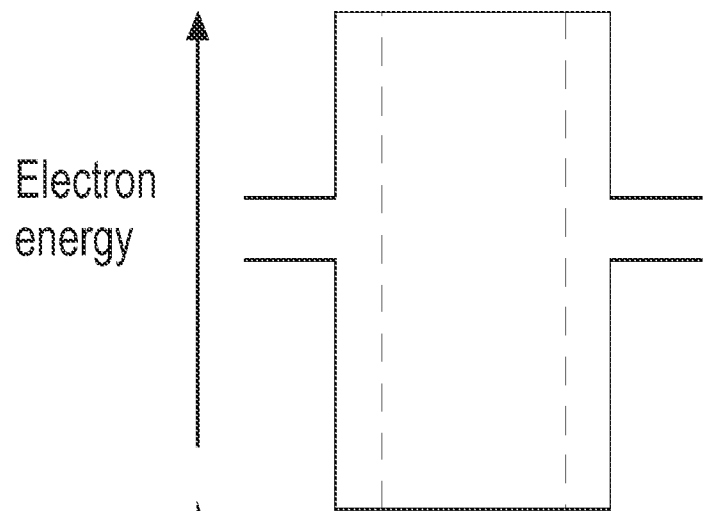
FIG. 14 is a drawing illustrating an energy band diagram of the insulating barrier of FIG. 13 when no voltage is applied.
Figure 15:
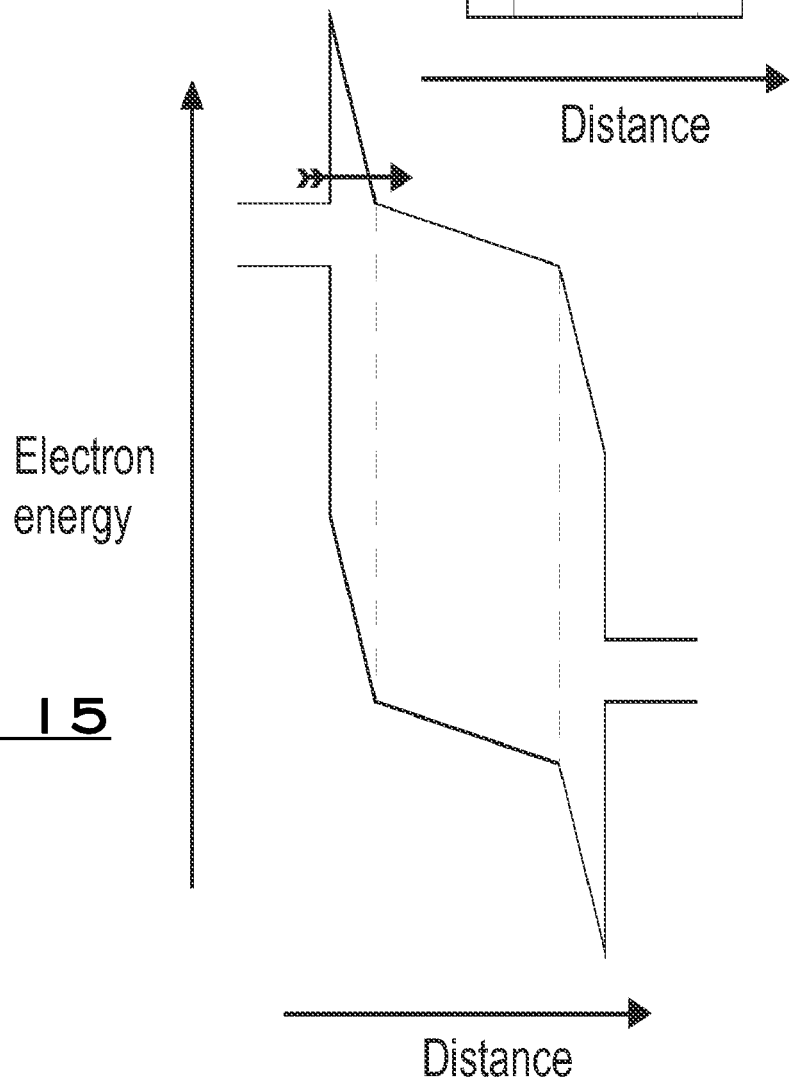
FIG. 15 is a drawing illustrating an energy band diagram of the insulating barrier of FIG. 13 when a tunneling voltage is applied.

The first and second dielectric materials are selected such that the insulating barrier 20 has energy band diagrams of the forms shown in FIGS. 14 and 15. The energy band diagram shown in FIG. 14 represents the structure illustrated in FIG. 13 when no voltage is applied over the insulating barrier 20. FIG. 15 is an energy band diagram representing the structure of FIG. 13 when a tunneling voltage is applied over the insulating barrier 20. In order to achieve the profile shown in FIG. 14, the first and second dielectric materials are selected such that they have substantially the same conduction band offset and bandgap. The profile shown in FIG. 15 is achieved by choosing the first and second dielectric materials such that the first dielectric material has a lower dielectric constant than the second dielectric material and that, upon applying a voltage suitable for tunneling over the insulating barrier 20, the voltage drop over the first layer 22 is higher than the voltage drop over the second layer 23.

The third layer 24, which has substantially the same thickness as the first layer 22 and is formed of the same dielectric material as the first layer 22, is provided in order to achieve an insulating barrier 20 with a symmetrical structure. In this way, the insulating barrier 20 is suitable for tunneling in both directions, e.g., from the conductive region 21 to the nitride layer 25 and vice versa.

The conductive region 21 (charge supply region) is formed from a conductive or semiconductive material. The conductive region 21 is for example a conductive layer constructed in heavily doped polysilicon (e.g., degenerately doped polysilicon having a doping concentration of more than $10^{19}/cm^3$), but may also be a semiconductor substrate. If the conductive region 21 is a polysilicon base layer, it is generally deposited, on top of other material layers, on a semiconductor substrate. The semiconductor substrate typically comprises single crystal silicon.

The first layer 22, with a low dielectric constant, is preferably constructed in silicon oxide, or silicon oxynitride with a low nitrogen concentration. The second layer 23, with a high dielectric constant, is preferably constructed in a metal oxide like aluminum oxide or zirconium oxide. The third layer 24, also with a low dielectric constant, is preferably constructed in the same material as the first layer 22 in order to obtain symmetric tunneling properties, but it may also be constructed in another material of a similar type.

The thickness of the second layer 23 is selected to be sufficient to block the flow of charge carriers when no voltage or a voltage below the maximum read-disturbance voltage of an associated memory cell is applied over the insulating barrier 20. This thickness may be selected in the range of 4-20 nm. The second layer 23 may, for example, be deposited using atomic layer chemical vapor deposition (ALCVD), among any other number of appropriate techniques.

Operation of the insulating barrier of FIG. 13 is described in the following discussion with reference to the band diagrams of this structure without bias (FIG. 14) and when a programming (tunneling) voltage is applied (FIG. 15).

The thickness of the first layer 22 and the third layer 24 of the dielectric stack of the insulating barrier 20 in FIG. 13 are selected based on a difference in energy band levels between the conductive region 21 and the second layer 23. In order to achieve high tunneling currents through the insulating barrier 20, the thickness of the first layer 22 is selected to be sufficient to allow the energy of electrons in the bottom of the conduction band of the second dielectric layer 23 to drop below the energy of electrons in the bottom of the conduction band of the conductive region 21 (in the case where the conductive region 21 is constructed in a doped semiconductive material) or its metal work function (in the case where the conductive region 21 is constructed in an intrinsically conductive material).

Similarly, the thickness of the third layer 24 is selected to be sufficient to allow the energy of electrons at the bottom of the conduction band of the second dielectric layer 23 to drop below the energy of electrons in the bottom of the conduction band of the nitride layer 25. In this way, a tunneling current is determined by tunneling through only the first layer 22, or the third layer 24. The same relationship is also valid when tunneling of holes is used. However, in the case of tunneling holes, the energy of the holes in the top of the valence bands should be used instead of the energy of the electrons at the bottom of the conduction band.

For the structure in FIG. 13, if the material used for the first and the third layers 22 and 24 is silicon dioxide, and aluminum oxide is used for the second layer 23, the thickness of the first and third layers 22, 24 is selected in the range of 2-3 nm. The thickness of the second layer 23 is selected such that the flow of an electric current through the barrier 20 at low electrical fields or voltages below the maximum read-disturbance voltage can be prevented. For this purpose, the thickness of the layer 23 is selected in the range of 6-20 nanometers. Higher thicknesses may be counterproductive since it is desirable that a larger portion of the voltage applied over the barrier 20 is dropped over the first and third dielectric layers 22, 24.

When applying a voltage over the insulating barrier 20 of FIG. 13, a significant fraction of that voltage will be dropped over the first and third layers 22, 24 since those layers have a lower dielectric constant than the second layer 23. Consequently, the energy barrier formed by the relatively thick second layer 23 will be lowered. In particular, the construction of the insulating barrier 20 is selected such that at a voltage suitable for tunneling, the energy barrier of the second layer 23 is lowered below the electron energy level of the conductive region 21 or the nitride layer 25 (depending on the tunneling direction), so that the tunneling current is largely determined by direct or Fowler-Nordheim tunneling through the thin first or third layer 22 or 24.

Figure 16:
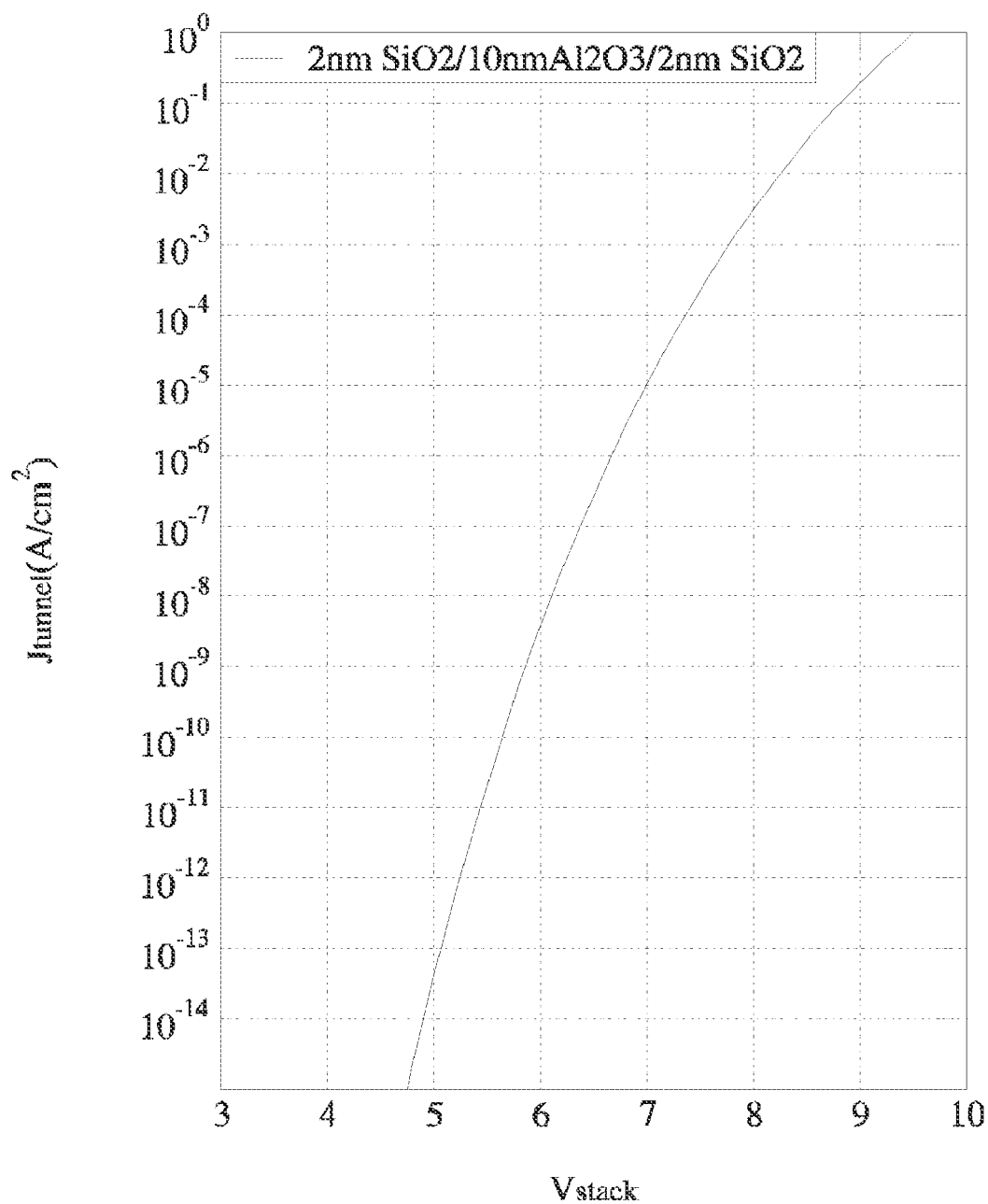
FIG. 16 is a plot of current versus voltage characteristics for the insulating barrier of FIG. 13.

For such an insulating barrier, leakage current at low electric fields is mostly determined by the leakage through the thicker second layer 23. As shown in the voltage-current graph in FIG. 16 and derived from FIG. 14, at low bias, the energy barrier presented to charge carriers for such a structure is sufficient to obtain a low leakage current and, therefore, acceptable retention times. As shown in FIGS. 15 and 16, the tunneling current at high electric fields is determined by the thin first and third dielectric layers 22, 24, such that high tunneling currents and short write/erase time can be achieved.

Figure 17:
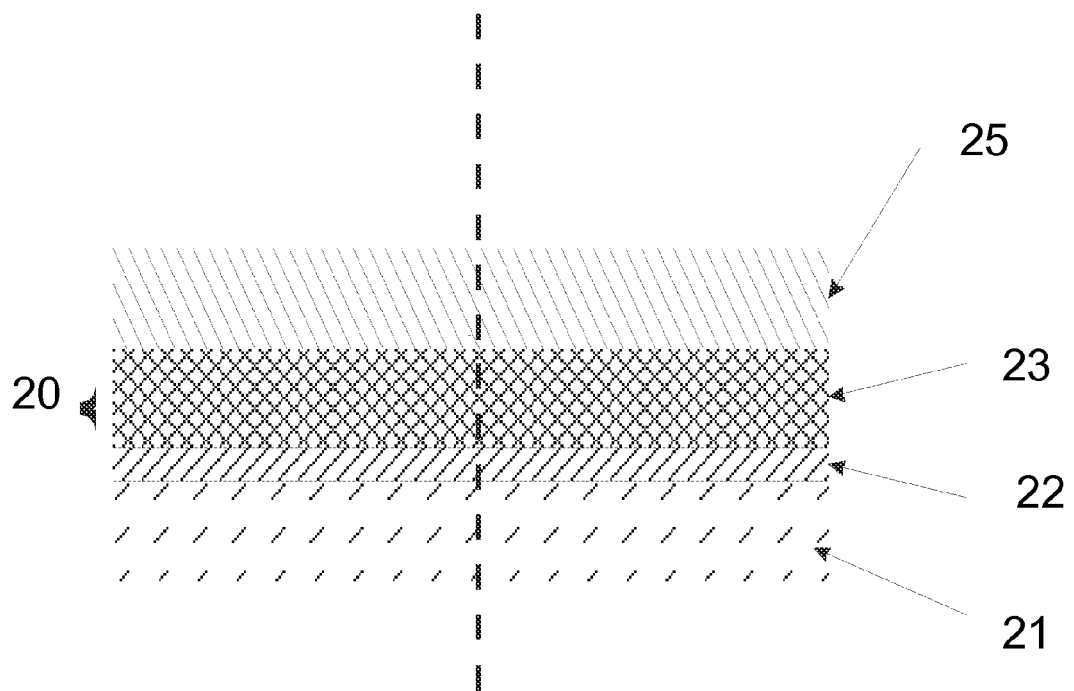
FIG. 17 is a drawing illustrating a cross-section of another embodiment of an insulating barrier according to the second aspect.

Referring to FIG. 17, another insulating barrier that may also be implemented in NVM devices in accordance with the second aspect described above is illustrated. This embodiment may be advantageous if tunneling of carriers in only a single direction is required. In this embodiment, it is possible to obtain a strong voltage dependence of current through the insulating barrier and a low voltage to enable tunneling, as is described below.

The insulating barrier 20 shown in FIG. 17 has a structure that is similar to that of the insulating barrier 20 illustrated in FIG. 13, with the third dielectric layer 24 being omitted. Alternatively, the first dielectric layer 22 could be omitted. For the sake of clarity, the description of this second embodiment will assume that the third dielectric layer 24 has been omitted, as is shown in FIG. 17. However, omission of the first layer 22 instead of the third layer 24 results in substantially the same operation of the insulating barrier 20.

The insulating barrier 20 in FIG. 17 extends between a conductive region 21 (charge supply region) and a nitride layer 25 (charge storage region) and includes first and second layers 22, 23, which are deposited one on top of the other. The first layer 22 is constructed in a first dielectric material having a low dielectric constant. The second layer 23 is substantially wider than the first layer 22 and is constructed in a second dielectric material having a higher dielectric constant than the first dielectric material.

Figure 18:
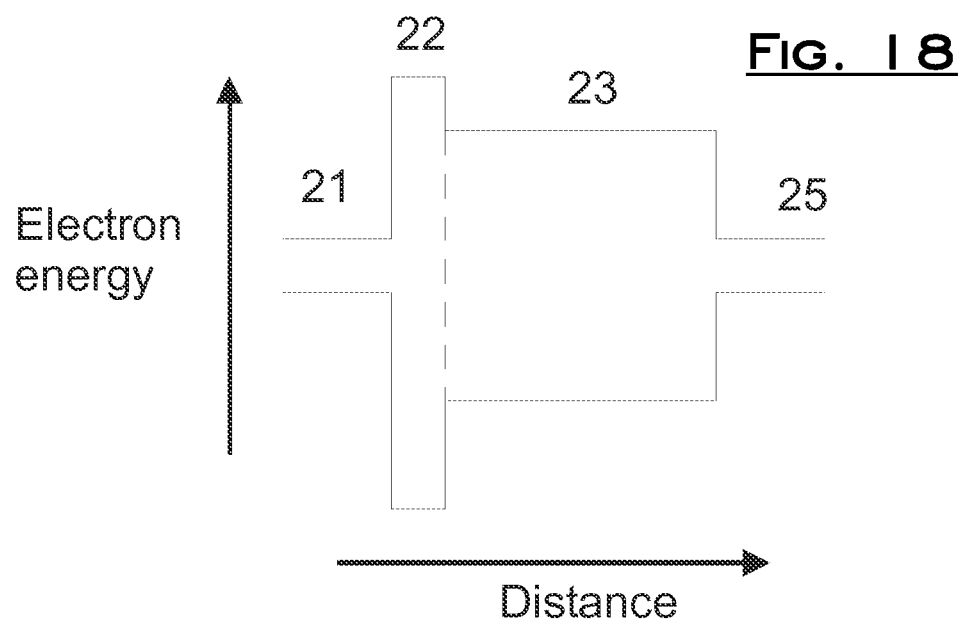
FIG. 18 is a drawing illustrating an energy band diagram of the insulating barrier of FIG. 17 when no voltage is applied.
Figure 19:
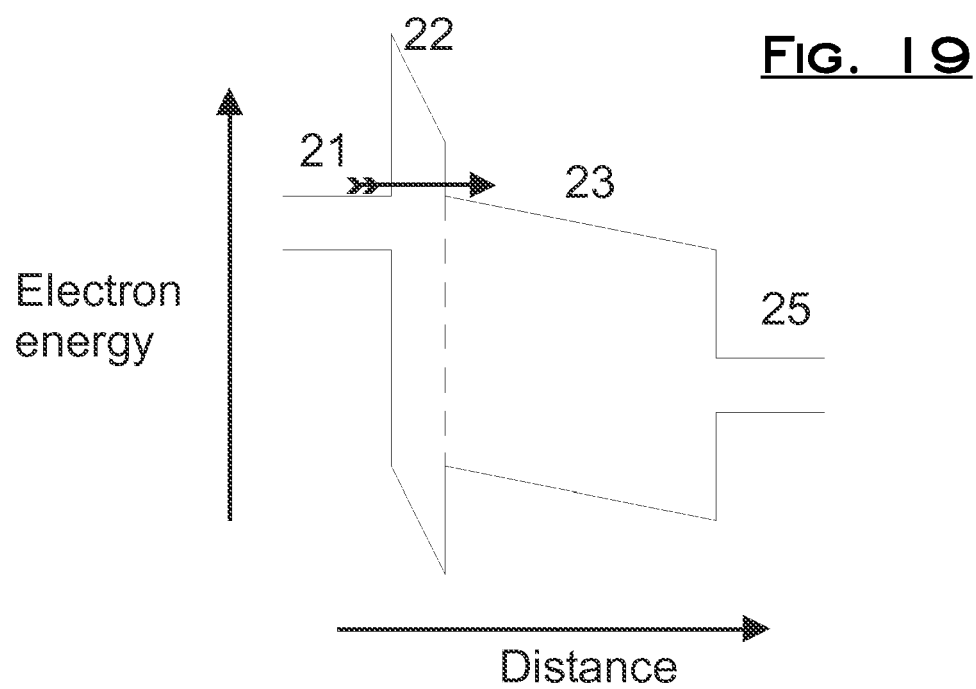
FIG. 19 is a drawing illustrating an energy band diagram of the insulating barrier of FIG. 17 when a tunneling voltage is applied.

The first and second dielectric materials are selected such that the insulating barrier 20 has an energy band diagram as shown in FIG. 18 when no voltage is applied over the barrier 20, and as shown in FIG. 19 when a tunneling voltage is applied over the barrier 20. In order to achieve the profile shown in FIG. 18, the first and second dielectric materials are selected such that the first portion 22 has a higher potential energy level than the second portion 23. In order to achieve the profile shown in FIG. 19, the dielectric materials are further selected such that the first dielectric material has a lower dielectric constant than the second dielectric material and that, upon applying a voltage suitable for tunneling carriers through the insulating barrier 20, the voltage drop over the first layer 22 is higher than the voltage drop over the second layer 23.

The conductive region 21 (charge supply region) is constructed using a conductive or semiconductive material. The conductive region 21 is, for example, a conductive layer formed of heavily doped polysilicon (for example degenerately doped polysilicon having a doping concentration of more than $10^{19}/cm^3$), but may also be formed from a semiconductor substrate. If the first conductive region 21 is a polysilicon base layer, it is generally deposited, on top of other material layers, on a semiconductor substrate. The semiconductor substrate typically comprises single crystal silicon.

The first layer 22 in FIG. 17 (with a low dielectric constant) may be implemented using silicon oxide or silicon oxynitride with a low nitrogen concentration. The second layer 23 (with a high dielectric constant) may be implemented using a metal oxide like aluminum oxide or zirconium oxide. If the material used for the first layer 22 is silicon dioxide, and aluminum oxide is used for the second layer 23, the thickness of the first layer 22 is selected in the range of 1.3-3 nm, or in the range of 1.5-3 nm.

The thickness of the first layer 22 is at least the thickness of the energy barrier of the second layer 23 divided by the breakdown electrical field of the first layer 22, which results in the energy barrier of the second layer 23 being substantially eliminated during tunneling. Following are some examples of such a calculation. For instance, if a second layer 23 of zirconium oxide having an energy barrier of 2 eV is combined with a first layer 22 of silicon dioxide having a electrical breakdown voltage of about 15 MV/cm, then a lower limit for the thickness of the first layer 22 would be: (2 eV)/(15 MV/cm)=1.33 nm. As another example, if a second layer 23 of aluminum oxide having an energy barrier of 3 eV is combined with a first layer 22 of silicon dioxide having a electrical breakdown voltage of about 15 MV/cm, then a lower limit for the thickness of the first layer 22 would be: (3 eV)/(15 MV/cm)=2.0 nm.

The thickness of the second layer 23 in FIG. 17 is selected so as to be sufficient to block the flow of charge carriers when no voltage or a voltage below a maximum read-disturbance voltage for an associated memory cell is applied over the insulating barrier 20. This thickness may be selected in the range of 6-20 nm. The second layer 23 may, for example, be deposited using atomic layer chemical vapor deposition (AL-CVD), or may be deposited using any other appropriate technique.

Figure 20:
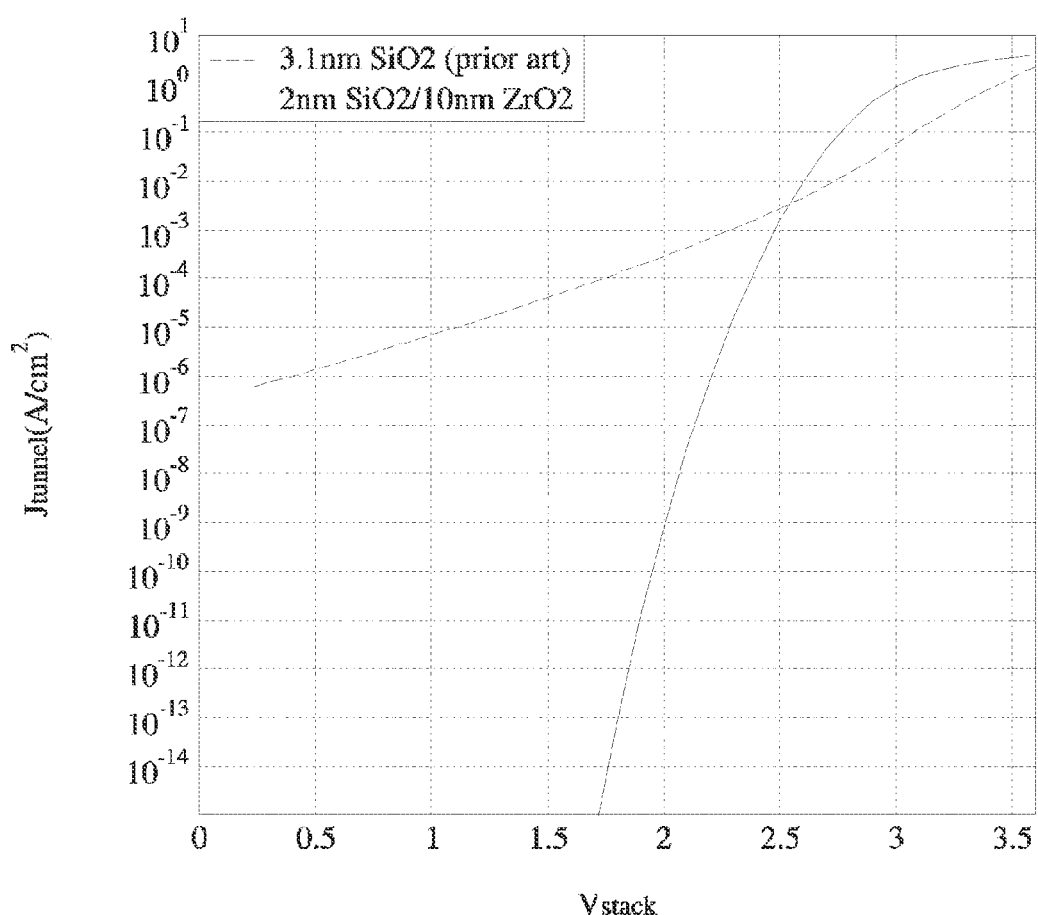
FIG. 20 is a plot of current versus voltage characteristics for the insulating barrier of FIG. 17.

The operation of the insulating barrier of FIG. 17 is similar to that of the insulating barrier of by FIG. 1. FIGS. 18 and 19 represent band diagrams of the structure of FIG. 17 without bias (FIG. 18) and when a programming (tunneling) voltage is applied (FIG. 19). Although the band diagrams of FIGS. 18 and 19 represent two dielectric materials with different bandgaps (e.g., $SiO_2$ and $ZrO_2$), the same band diagrams would also be valid when using two dielectric materials with approximately the same bandgap (for example the combination of $SiO_2$ and $Al_2O_3$). As shown in FIG. 20, the structure of FIG. 17 allows for a lower applied voltage to obtain sufficient barrier lowering in the first layer 22 with a high dielectric constant so as to allow a tunneling current to efficiently flow as compared to prior approaches. It is noted, however, that the improvement in tunnel current efficiency for the structure in FIG. 17 is only achieved in one direction.

The insulating barriers and memory devices described above with reference to FIGS. 13-20 only refer to use of nitride layer for charge storage. It will be appreciated, however, that the charge storage layers of such devices may also be implemented in other manners, such as using a layer including Si or Ge nanocrystals, or using a non-conductive layer (other than a nitride layer) that includes charge traps.

Example Memory Devices

In the following discussion, four different embodiments of memory devices including insulating barriers as described herein will be discussed. Utilizing insulating barriers as described herein enables the example memory devices including such barriers to be written and/or erased with lower programming and/or erase voltages than previous devices. These four memory devices are described as including floating gate structures for charge storage. It will be appreciated, however, that the floating gate structures of these four memory cells may be replaced with charge trapping layers in accordance with the second aspect described above.

Figure 21:
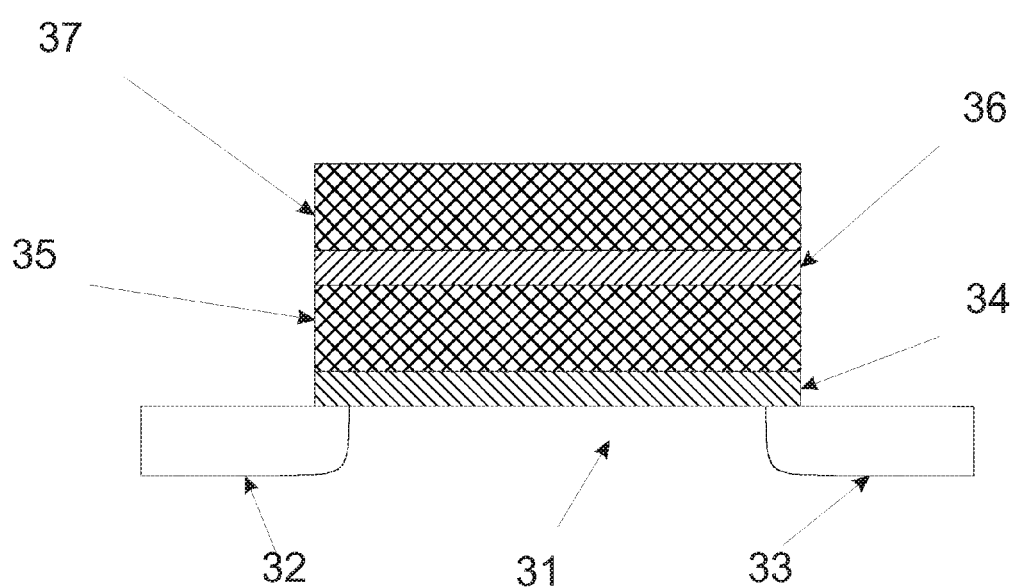
FIG. 21 is a drawing illustrating a cross-section of a memory device according to the second aspect.

Referring to FIG. 21, a first memory device is shown. The device of FIG. 21 includes a semiconductor substrate with heavily doped regions 32 and 33, which are separated by a channel region 31 (charge supply region). A first insulating barrier 34 (insulating barrier) is formed on top of the semiconductor substrate. This first insulating barrier 34 can, for example, be formed of a single layer of silicon oxide and should have a sufficient thickness to prevent any substantial leakage current from flowing through it. Alternatively, the insulating barrier 34 may be similar to an interpoly dielectric, or may include a single layer of silicon dioxide that is grown on the semiconductor substrate. In the case that the insulating barrier 34 includes a silicon dioxide layer, the thickness of the silicon dioxide layer may very thin (e.g., 5-7 nm), as no charge has to be transferred through this layer and, therefore, that layer will not suffer from the effects of Stress Induced Leakage Current (SILC).

On top of the first insulating barrier 34, a floating gate 35 (charge storage region) is formed. The floating gate 35 may, for example, consist of highly doped n-type polysilicon.

A second insulating barrier 36 (such as the second insulating barrier 4 in FIG. 1) is deposited on top of the floating gate layer 35. The second insulating barrier 36 is similar to the insulating barrier 20 according to the first embodiment of the second aspect of the invention as shown in FIG. 13.

A control gate 37 (control region) is located on top of the second insulating barrier 36. This control gate 37 may, for example, be formed of highly doped n-type polysilicon.

Information stored in the memory cell of FIG. 21 is determined by the amount of charge stored on the floating gate 35. The readout of the memory cell of FIG. 21 can be done by using the control gate 37 and heavily doped regions 32 and 33 respectively as a gate, a drain and a source of the memory cell. The presence of stored charge on the floating gate 35 leads to a shift in the threshold voltage of the transistor (e.g., the gate voltage at which the channel region 31 becomes conductive) which can easily be detected.

Writing and erasing of the memory cell of FIG. 21 is done by tunneling of charge carriers through the second insulating barrier 36. In order to obtain short write/erase time, a sufficient voltage drop should occur between the floating gate 35 and the control gate 37. The voltage on the floating gate 35 can be set by using the capacitive coupling between the floating gate 35, the control gate 37 and the regions 31, 32 and 33 of the semiconductor substrate. The use of an embodiment of an insulating barrier 20 as illustrated in FIG. 13 as the second insulating barrier 36 of the memory cell of FIG. 21 enables the writing and erasing of this memory cell at a reduced voltage with respect to the prior art, without adversely affecting the retention time of the cell.

Figure 22:
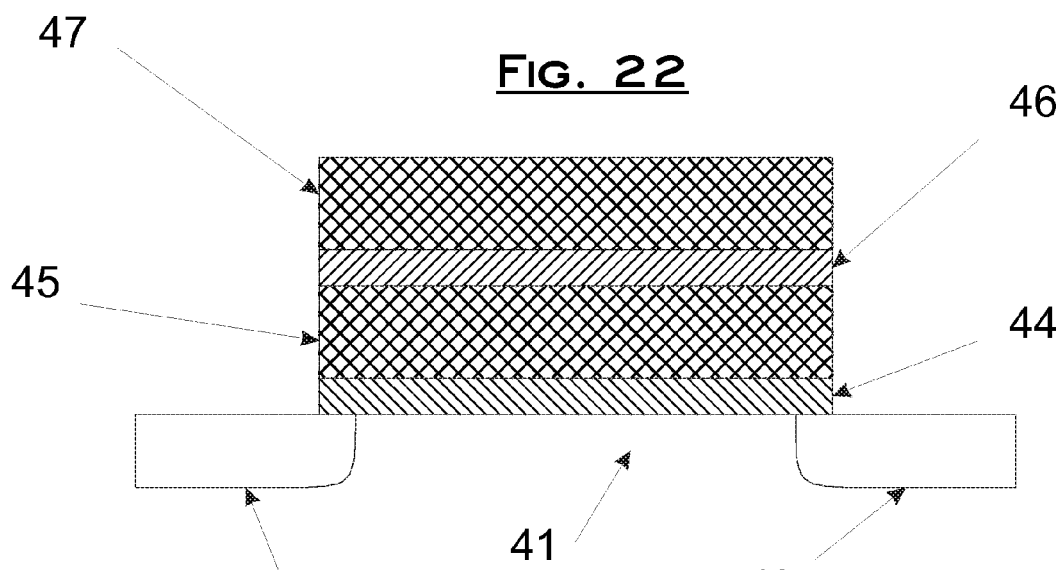
FIG. 22 is a drawing illustrating a cross-section of another memory device according to the second aspect.
Figure 23:
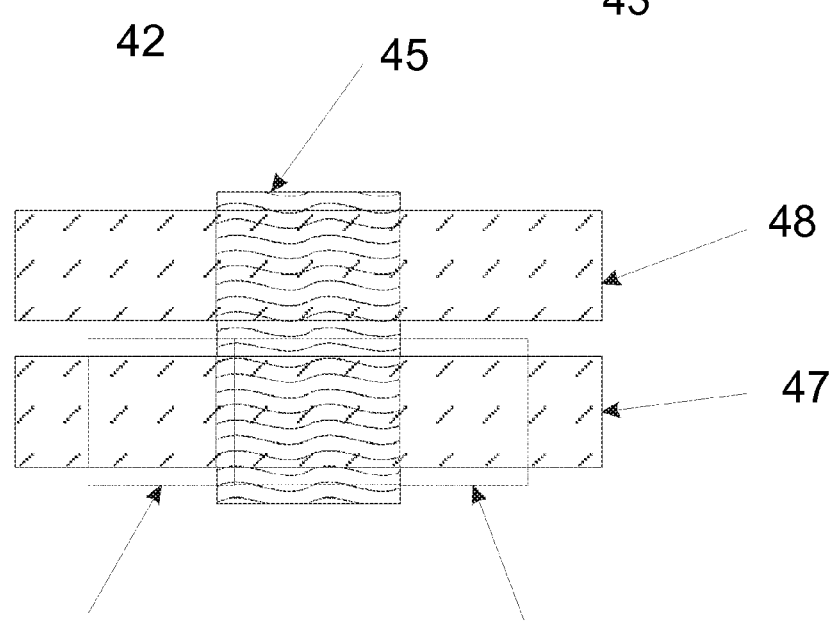
FIG. 23 is a drawing illustrating an example layout for the memory device of FIG. 22.

Referring to FIGS. 22 and 23, a second memory device is shown. The device of FIGS. 22 and 23 includes a semiconductor substrate with heavily doped regions 42 and 43, which are separated by a channel region 41 (charge supply region). A first insulating barrier 44 is formed on top of the semiconductor substrate. This insulating barrier 44 is similar to the insulating barrier illustrated in FIG. 17, with a first layer of dielectric material having a low dielectric constant contacting the substrate. On top of this first insulating barrier 44, a floating gate 45 (charge storage region) is deposited. The floating gate 45 may, for example, be formed of highly doped n-type polysilicon. A second insulating barrier 46 is located on top of the floating gate 45. This second insulating barrier 46 is also similar to the insulating barrier shown in FIG. 17, with a first layer of dielectric material having a low dielectric constant contacting the floating gate 45. A control gate 47 (control region) is located on top of the second insulating barrier 46. The control gate 47 may, for example, be formed from highly doped n-type polysilicon.

The second memory device of FIGS. 22 and 23 further includes a program gate 48, which is capacitively coupled to the floating gate region 45. This program gate 48 may be formed of a different material layer, or may be formed as a separate part of the control gate 47 layer. Such separation between the control gate 47 and the program gate 48 may be achieved using a patterning technique, such as a combination of photolithography and etching.

Information stored in the memory cell of FIGS. 22 and 23 is determined by the charge stored on the floating gate 45. Readout of the memory cell may be accomplished using the control gate 47 (and/or program gate 48) and the heavily doped regions 42 and 43 respectively as a gate, a drain and a source of the transistor cell. The presence of stored charge in the floating gate 45 leads to a shift in the threshold voltage of the memory cell transistor of FIGS. 22 and 23 (e.g., the gate voltage at which the channel region 41 becomes conductive), which can easily be detected.

For the sake of clarity, it is assumed in describing the operation of the memory cell of FIGS. 22 and 23 that electrons are used as stored charge carriers and that the charge carriers flow from the semiconductor substrate towards the control gate 47. It is, however, also possible to assume that holes are used as stored charge carriers, which implies that opposite polarities would be used for writing and erasing. This distinction does not, however, imply an essentially different mechanism of operation.

Writing the memory cell of FIGS. 22 and 23 (e.g., tunneling charge carriers onto the floating gate) is done through the first insulating barrier 44 and erasing is done through the second insulating barrier 46. In order to write the memory cell in a short amount of time, a sufficiently high programming voltage is applied between the semiconductor substrate and the floating gate region 45. This voltage is achieved by applying a positive voltage relative to the substrate to both the control gate 47 and the program gate 48. Due to capacitive coupling between the floating gate 45 and both the control gate 47 and the program gate 48, the voltage of the floating gate 45 is raised to a substantial fraction of the voltage or voltages applied to the control gate 47 and the program gate 48. The voltage on the floating gate 45 enables tunneling of charge carriers from the semiconductor substrate to the floating gate 45, so that the memory cell is written.

Similarly, in order to erase the memory cell, a sufficiently high voltage is applied between the floating gate 45 and the control gate 47. This voltage is achieved by applying a negative voltage relative to the control gate 47 to both the substrate and the program gate 48. Instead of applying a negative voltage to the substrate and the program gate 48, it is also possible to apply a positive voltage to the control gate 47 and zero (ground) or a small positive voltage to the substrate and the program gate 48. Due to capacitive coupling between the floating gate 45 and both the substrate and the program gate 48, the voltage of the floating gate 45 remains sufficiently low so that a high voltage difference is obtained between the floating gate 45 and the control gate 47. This high voltage enables tunneling of charge carriers from the floating gate 45 to the control gate 47, such that the memory cell is erased.

The memory cell of FIGS. 22 and 23 may be written and erased with a relatively low tunneling voltage Furthermore, current consumption during writing and erasing of the memory cell is low so that the tunneling voltage can easily be obtained from a lower supply voltage, such as, for example, 1.8V or lower through the use of voltage elevation or charge pump circuits, which can be constructed on the same semiconductor substrate as the memory cell.

Furthermore, since the insulating barriers 44, 46 of the device shown in FIGS. 22 and 23 are only suitable for transporting charge by tunneling in one direction, the memory cell may be operated such that its performance does not substantially suffer from undesired altering of the content of the memory cell during readout operations, which can be achieved by the use of different gate voltage polarities for writing and reading the memory cell.

Figure 26:
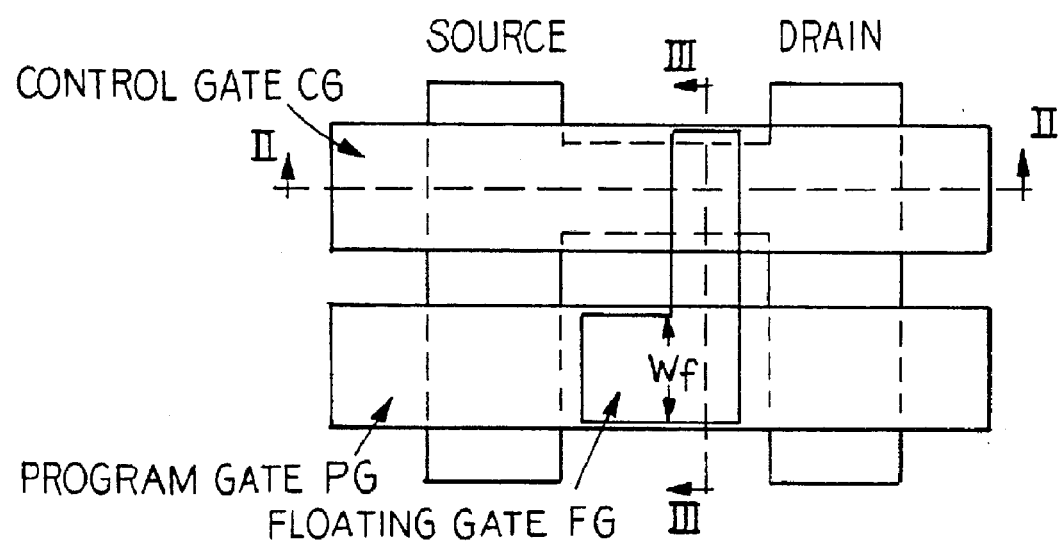
FIG. 26 is a drawing illustrating an example layout for the memory device of FIGS. 24 and 25.

Referring to FIGS. 24, 25 and 26, a third memory device is shown. In this memory cell, writing of the memory cell is achieved by means of hot electron injection, such as is for example known from the HIMOS™ cell which is described in U.S. Pat. No. 5,583,810. However, the interpoly dielectric between the control gate 57 and the floating gate 55 (charge storage region) of the HIMOS™ cell is replaced by an insulating barrier 56 as shown in FIG. 17, with a first layer of dielectric material having a high dielectric constant contacting the floating gate 55. This replacement leads to a certain number of important improvements in the operation of the memory cell of FIGS. 24, 25 and 26 with respect to the HIMOS™ cell.

Erasing of the resulting HIMOS™ cell is accomplished by tunneling charge carriers between the floating gate and the control gate. This tunneling can either be Fowler-Nordheim tunneling, or tunneling through a polyoxide where asperities of the underlying layer enhance the electric field and, hence, the tunneling current. In both cases, the required erase voltage is always higher than the voltage that is applied to program the device. Replacing the interpoly dielectric using the insulating barrier 56 (such as illustrated in FIG. 17) allows a significant reduction in the erase voltage for the memory cell of FIGS. 24, 25 and 26 as compared to the HIMOS™ cell. This reduction of the erase voltage has multiple advantages. For instance, the manufacturing flow can be simplified since the difference between the normal transistors and "high-voltage" transistors becomes smaller, thus reducing the need for highly specialized high voltage circuitry and associated processing operations. Furthermore, the much less stringent specifications of the "high-voltage" generation circuitry, and generally the smaller size of high-voltage transistors allow for a considerable circuit area reduction.

Additionally, the high dielectric constant and low dielectric equivalent oxide thickness of the insulating barrier 56 allows for a reduction of the program gate area, while maintaining a high coupling ratio between the program gate and the floating gate. This higher coupling ratio between the program gate and the floating gate also allows for a reduction of the programming voltage.

In the memory device illustrated in FIGS. 24, 25 and 26, programming is accomplished by channel hot electron injection through the insulating barrier 54, which is, for example, an oxide layer. In such an approach, the gate voltages may be reduced. However, the drain voltage and current requirements remain the same as in the previous HIMOS™ cell. Nevertheless, it is also possible to reduce the drain voltage for hot electron injection, as is described below.

A fourth memory device is shown in FIGS. 27 and 28. This memory cell allows for reduced drain voltages for hot electron injection. This memory cell also corresponds to the HIMOS™ cell, but the tunnel oxide of the memory cell is replaced by an insulating barrier 54 such as the insulating barrier 20 shown in FIG. 17, with a first layer of dielectric material with a low dielectric constant contacting a nitride layer 55 (charge storage region). If a material with a high dielectric constant and a lower bandgap than silicon dioxide is selected, this barrier 54 allows hot electron injection programming at a lower drain voltage.

The insulating barrier 54 of the memory cell of FIGS. 27 and 28 may include, for example, a stack of two layers such as a relatively thick (8-20 nm) zirconium dioxide layer and a relatively thin (1.5-3 nm) silicon dioxide layer. Additionally, a thin silicon nitride barrier layer (<2 nm) may be provided as a diffusion barrier between the zirconium dioxide layer and the substrate in order to prevent oxidation of silicon in the substrate.

Figure 29:
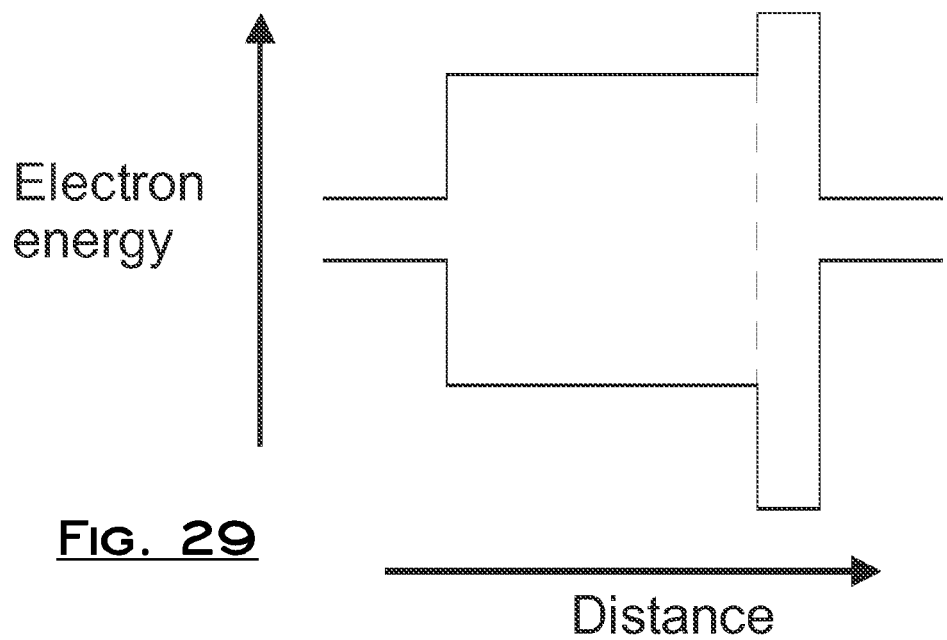
FIG. 29 is a drawing illustrating an energy band diagram for the memory device of FIGS. 27 and 28 when no voltage is applied across the insulating barrier.
Figure 30:
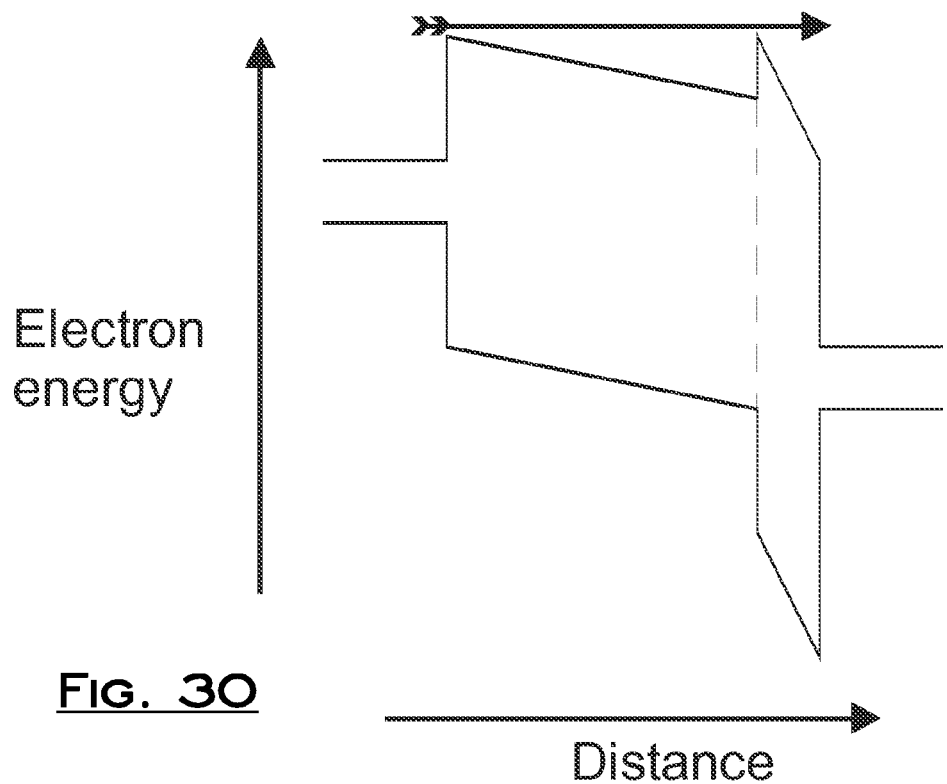
FIG. 30 is a drawing illustrating an energy band diagram for the memory device of FIGS. 27 and 28 with an applied bias that is favorable for hot carrier injection.

The replacement of the tunnel oxide with the insulating barrier 54 enables programming and erasing of the cell with a significantly reduced operating voltage with respect to the HIMOS™ cell. The low energy barrier height of the dielectric layers with high dielectric constants allows the use of a low drain voltage for writing the memory cell using hot carrier injection. The effect of the higher energy barrier of the silicon dioxide layer may be compensated for by applying a positive voltage to a program gate 58. This approach is illustrated by the energy band diagrams of FIGS. 29 and 30. The barrier composition, as described above, allows for efficient low-voltage tunneling for erasing the memory cell. Therefore, the entire write/erase functionality of the memory cell can be achieved with a lower power supply voltage, and a sufficient data retention time can still be achieved because of the large physical thickness of the dielectric stack.

Example Features and Advantages

In the following discussion, some example features and advantages of embodiments of memory devices in accordance with the two aspects discussed above are described. It will be appreciated that these are given by way of example and other features and advantages certainly exist. In this discussion, the reference numbers used are the reference numbers that have been used to refer to analogous and/or like elements in the various drawings. Therefore, the reference numbers used in the below discussion may refer to any number of the various drawings that include such references.

In the insulating barriers described herein, the thicknesses and materials of the tunneling dielectrics of the first portion 22 and second portion 23 of such insulating barriers are selected such that upon applying an electric field suitable for tunneling positive or negative charge carriers through the insulating barrier, the applied electric field over the first portion 22 is stronger than the applied electric field over the second portion 23. This has the advantage that the potential energy barrier, upon applying an electric field for tunneling, will show a steeper inclination over the first portion 22 than over the second portion 23, such that tunneling can be achieved at low externally applied voltages and, consequently, may reduce power consumption.

Furthermore, the thicknesses and the materials of the tunneling dielectrics of the first portion 22 and the second portion 23 may be selected such that upon applying an electric field suitable for tunneling positive or negative charge carriers through the insulating barrier, the potential energy barrier of the second portion 23 for tunneling carriers is suppressed more than the potential energy barrier of the first portion 22. This situation will increase the tunneling current used to change the logic state of the device such that an associated NVM device can be operated at lower externally applied voltages, which can also reduce the power consumption.

The tunneling dielectrics of the first portion 22 and the second portion 23 are also selected such that, in absence of an electric field over the insulating barrier, the first portion 22 has a higher potential energy barrier than the second portion 23 for both negative and positive charge carriers tunneling from a charge supply region 21 to a charge storage region 25. This can enhance data retention of NVM devices in which such insulating barriers are implemented.

As described above, an insulating barrier in accordance with the first aspect may be constructed as a two-layered structure, where dielectric materials of a first portion 22 and a second portion 23 are selected from the group comprising: SiO2, silicon oxynitride, e.g. SiON, or Si3N4, Si3N4, Al2O3, HfO2, Hf silicate, e.g. HfSiOx or HfSiON, Hf aluminate, e.g. HfAlOx, ZrO2, Pr2O3, Y2O3, La2O3 or La-aluminate, e.g. LaAlO. The first portion 22 may be constructed using a dielectric material with a dielectric constant lower than 15, and the second portion 23 may be constructed using a dielectric material with a dielectric constant higher than 7, where the first portion 22 has, on average, a lower dielectric constant than the second portion 23.

Further, the dielectric materials of the first portion 22 and the second portion 23 are selected such that, in absence of a voltage difference over the insulating barrier, the first portion 22 has a higher potential energy barrier than the second portion 23. For instance, in such a situation, an energy band diagram of the insulating barrier has a stepped profile with a higher step over the first portion 22 than over the second portion 23. This has the advantage that the voltage dependence of the insulating barrier can be increased, as the profile comprises a vertically descending part between the first portion 22 and the second portion 23. Such an arrangement enables direct tunneling instead of Fowler-Nordheim tunneling through the first portion 22. In this way, the voltage used for tunneling can be reduced. Such embodiments also have the advantage that the energy band diagram during tunneling descends monotonically. Such embodiments have the same advantages discussed above with respect to FIG. 17, such as using a less complicated (non-symmetric) insulating barrier structure and allowing for higher tunneling currents at lower voltages, for example.

As previously described, an insulating barrier according to the first aspect may comprise a first portion 22 contacting a first region 21 and a second portion 23 contacting the first portion 22 and extending toward a second region 25. In one example, the first portion 22 is substantially thinner than the second portion 23. In this example, the first portion 22 is constructed in a first dielectric and the second portion 23 in a second dielectric, where the second dielectric differs from and has a higher dielectric constant than the first dielectric. Due to the higher dielectric constant of the second portion 23, the first portion 22 will have a larger voltage drop than the second portion 23 when a voltage is applied over the example insulating barrier. For instance, the electric field over the first portion 22 will be stronger than the electric field over the second portion 23. As a result, an energy band diagram over the first portion 22 has stronger voltage dependence than an energy band diagram over the second portion 23. For example, the energy band diagram upon applying a suitable voltage for tunneling will show a steeper inclination over the first portion 22 than over the second portion 23. In this way, less tunneling voltage is used to reduce an energy barrier during tunneling by an equivalent amount as compared to a single-layer insulating barrier of prior devices. Furthermore, as the first portion 22 is substantially thinner than the second portion 23, the profile for the second portion 23 during tunneling comprises a larger part of the overall energy band profile and has a more shallow inclination, which allows for reducing the tunneling voltage by a substantial amount with respect to single-layer insulating barriers.

Suitable material combinations for insulating barriers as described herein are, for example, $SiO_2$ or $Si_3N_4$ for the first portion 22 and $Al_2O_3$, $HfO_2$ or $ZrO_2$ for the second portion. The second portion 23 can, for example, be deposited by a technique such as atomic layer chemical vapor deposition (ALCVD). Furthermore, $Al_2O_3$, $HfO_2$ and $ZrO_2$ are high-barrier materials which are currently being used in standard silicon semiconductor technologies, for example in the standard CMOS transistor processes. As a result, such insulating barriers may be readily constructed, as the use of additional materials that are not already used in normal transistor manufacturing processes can be avoided. Of course, any other material combinations may also be used to form such insulating barriers.

The first and second dielectrics that are used to construct a first portion 22 and a second portion 23 of an insulating barrier, such as those described herein, may each comprise a single dielectric material. However, the first and second dielectrics may also each comprise a plurality of suitable dielectric materials which are stacked one on top of each other. In such an arrangement, materials and thicknesses of the dielectric materials would be selected so that the average dielectric constant of the first portion 22 is lower than the average dielectric constant of the second portion 23.

As has been previously discussed, the materials and thicknesses of the first portion 22 and second portion 23 of an insulating barrier are selected such that, upon applying a voltage suitable for tunneling over the insulating barrier, the voltage drop over the first portion 22 is higher than the voltage drop over the second portion 23. This has the advantage that the largest part of the tunneling voltage will be dropped over the first portion 22, which is substantially thinner than the second portion. As a result, the tunneling voltage may be reduced as compared to prior approaches.

As was also described above, an insulating barrier may further comprise a third portion 24 extending between the second portion 23 and the second region 25. This third portion 24 is substantially thinner than the second portion 23 and is constructed in a third dielectric, which has a lower dielectric constant than the second dielectric. In such an arrangement, the resulting insulating barrier is suitable for tunneling carriers in both directions, e.g., from the first region 21 to the second region 25, as well as from the second region 25 to the first region 21. As previously described, the third portion 24 may be constructed with substantially the same thickness as the first portion 22 and in the same dielectric material as the first portion 22, so that the resulting insulating barrier has a symmetrical structure. However, the thickness and the dielectric material of the third portion 24 may also be different from that of the first portion 22, while still allowing for efficient tunneling in both directions.

In one such embodiment, the dielectric materials of the three portions 22,23,24 are selected such that, in absence of a voltage difference over the insulating barrier, the three portions 22,23,24 have substantially the same potential energy barrier. This has the advantage that the energy band diagram does not include any steps. In this situation, during tunneling, the energy band diagram descends monotonically. Using such an approach, the second portion 23 does not form any substantial additional barrier during tunneling.

Furthermore, for this example, in absence of a voltage difference over the insulating barrier, the first portion 22 and third portion 24 each provide an additional energy barrier to the energy barrier which is formed by the second portion 23, as the potential energy levels of the first portion 22 and the third portion 24 are sufficiently high to prevent electrons traveling to the first portion 22 and the third portion 24 by thermionic emission, which can occur when materials that have lower potential energy barriers than the second portion 24 are used for the first portion 22 and/or the third portion 24. As a result, the thickness of the second portion 23 can be reduced in such an insulating barrier as compared to insulating barriers that use lower potential energy materials for the first portion 22 and the third portion 24.

In NVM devices as those described herein, structures may be provided for establishing an electric field so as to apply a voltage between a charge supply region 21 and a charge storage region 25. Further, tunneling dielectric materials and thicknesses of those material for a first portion 22 and a second portion 23 of an insulating barrier are selected, such that, upon applying a voltage suitable for tunneling charge carriers (positive or negative) through the insulating barrier, the potential energy barrier of the second portion 23 for tunneling charge carriers (positive or negative) is substantially removed. Such an approach can increase tunneling current as compared to prior approaches, which may result in improved low voltage operation and a reduction in power consumption.

The structures for establishing a tunneling current may comprise a control region 5 which is located on an opposite side of the charge storage region 25 with respect to the charge supply region 21 and is separated from the charge storage region 25 by a second insulating barrier 4. The second insulating barrier 4 may have a predetermined thickness for blocking charge carrier transfer between the control region 5 and the charge storage region 25. The second insulating barrier may be constructed from SiO2, Si3N4, Al2O3, HfO2, Hf-silicate, or Hf-aluminate, or a combination of these materials. The control region 5 may be constructed using highly doped poly-Si, a metal, or a compound with metallic character. For the case where a metal or a compound with metallic character is used, the control region 5 may have a work function of 4 eV or higher.

CONCLUSION

While a number of aspects and embodiments have been discussed above, it will be appreciated that various modifications, permutations, additions and/or sub-combinations of these aspects and embodiments are possible. It is therefore intended that the following appended claims and claims hereafter introduced are interpreted to include all such modifications, permutations, additions and/or sub-combinations as are within their true spirit and scope.

What is claimed is:

1. A non-volatile memory device comprising:
   a charge supply region;
   a charge storage medium;
   a first insulating barrier between the charge supply region and the charge storage medium;
   a control region, wherein the control region and the charge supply region are on opposite sides of the charge storage medium;
   a second insulating barrier between the control region and the charge storage medium, wherein the second insulating barrier includes at least one high-k dielectric and at least one low-k dielectric, and wherein the second insulating barrier comprises:
   a first portion neighboring the control region; and a second portion neighboring the charge storage medium, wherein the first portion has on average a lower dielectric constant than the second portion.

2. A non-volatile memory device according to claim 1, wherein the first portion of the second insulating barrier is a layer of a dielectric selected from the group consisting of a silicon oxide, a silicon nitride, and a silicon oxynitride layer.

3. A non-volatile memory device according to claim 2, wherein the second portion of the second insulating barrier is a layer of a dielectric selected from the group consisting of: an aluminum oxides, a hafnium oxide, a hafnium silicate, HfSiON, a hafnium aluminate, and a zirconium oxide.

4. A non-volatile memory device according to claim 3, wherein the control region is constructed of a material selected from the group consisting of a highly-doped poly-Si, a metal and a compound with metallic character.

5. A non-volatile memory device according to claim 4, wherein the control region is constructed of a material having a work function of at least 4 eV.

6. A non-volatile memory device according to claim 1, wherein the second portion of the second insulating barrier is a layer of a dielectric selected from the group consisting of: an aluminum oxides, a hafnium oxide, a hafnium silicate, HfSiON, a hafnium aluminate, and a zirconium oxide.

7. A non-volatile memory device according to claim 6, wherein the second insulating barrier has a predetermined thickness selected for blocking charge carrier transfer between the control region and the charge storage medium.

8. A non-volatile memory device according to claim 1, wherein the second insulating barrier has a predetermined thickness for blocking charge carrier transfer between the control region and the charge storage medium.

9. A non-volatile memory device according to claim 1, wherein the control region is constructed of a material selected from the group consisting of a highly-doped poly-Si, a metal and a compound with metallic character.

10. A non-volatile memory device according to claim 9, wherein control region is constructed of a material having a work function of at least 4 eV.

11. A non-volatile memory device according claim 1, wherein the first insulating barrier comprises:
a first portion contacting the charge supply region, the first portion comprising at least one first tunneling dielectric; and
a second portion contacting the first portion and extending towards the charge storage medium, the second portion comprising at least one second tunnelling dielectric;
wherein the first portion has on average a lower dielectric constant than the second portion, and the first portion is substantially thinner than the second portion.

12. A non-volatile memory device according to claim 11, wherein the charge storage medium is a floating gate.

13. A non-volatile memory device according to claim 11, wherein the charge storage medium is chosen from the group consisting of a charge trapping silicon nitride layer, a charge trapping high-k dielectric layer, a silicon-rich oxide, and a dielectric layer having small embedded conductive islands isolated from each other.

14. A non-volatile memory device according to claim 13, wherein the charge storage medium is a dielectric layer having small embedded conductive islands isolated from each other, and the small conductive islands are made of Si or Ge nanocrystals.

15. A non-volatile memory device according to claim 1, wherein the thickness of the second insulating barrier is selected such that, at a first electric potential applied between the control region and the charge supply region, charge carriers are transferred through the first insulating barrier and not through the second insulating barrier.

16. A non-volatile memory device according to claim 1, wherein the second portion of the second dielectric layer consists essentially of a dielectric selected from the group consisting of $Al_2O_3$, $HfO_2$, $HfSiO_x$, $HfSiON$, $HfAlO_x$, and $ZrO_2$.

17. A non-volatile memory device according to claim 1, wherein the control region is constructed of a material having work function ranging from about 4.5 eV to about 5.5 eV.

18. A non-volatile memory device comprising:
a charge storage medium;
a first insulating barrier on a first side of the charge storage medium;
a second insulating barrier on a second side of the charge storage medium opposite the first side, the second insulating barrier comprising a low-k layer and a high-k layer, wherein the high-k layer is adjacent to the charge storage medium; and
means for applying, across the first insulating barrier, the second insulating barrier, and the charge storage medium, an electric field sufficient to induce carrier exchange across the first insulating barrier and not across the second insulating barrier.

19. A non-volatile memory device according to claim 18, wherein the first insulating barrier comprises a low-k layer and a high-k layer, and wherein the high-k layer is adjacent to the charge storage medium.

20. A non-volatile memory device comprising:
a channel region;
a first dielectric layer on the channel region;
a second dielectric layer on the first dielectric layer;
a charge storage medium on the second dielectric layer;
a third dielectric layer on the charge storage medium;
a fourth dielectric layer on the third dielectric layer; and
a control region on the fourth dielectric layer;
wherein an average dielectric constant of the first dielectric layer is lower than an average dielectric constant of the second dielectric layer, and an average dielectric constant of the fourth layer is lower than an average dielectric constant of the third layer.

* * * * *